US011776422B2

(12) United States Patent
Lussier

(10) Patent No.: US 11,776,422 B2
(45) Date of Patent: Oct. 3, 2023

(54) METHOD FOR ASSEMBLING OR REPAIRING A CONNECTORIZED ELECTRICAL EQUIPMENT IN AN ENVIRONMENT

(71) Applicant: ZIOTA TECHNOLOGY INC., Magog (CA)

(72) Inventor: Alain Lussier, Ogden (CA)

(73) Assignee: ZIOTA TECHNOLOGY INC., Magog (CA)

( * ) Notice: Subject to any disclaimer, the term of this patent is extended or adjusted under 35 U.S.C. 154(b) by 0 days.

(21) Appl. No.: 17/536,883

(22) Filed: Nov. 29, 2021

(65) Prior Publication Data

US 2022/0084434 A1   Mar. 17, 2022

Related U.S. Application Data

(63) Continuation of application No. 16/208,743, filed on Dec. 4, 2018, now Pat. No. 11,205,353, which is a continuation-in-part of application No. 15/680,490, filed on Aug. 18, 2017, now Pat. No. 10,705,135, which is a continuation-in-part of application No. 14/230,955, filed on Mar. 31, 2014, now Pat. No. 9,817,942.

(60) Provisional application No. 61/806,899, filed on Mar. 31, 2013.

(51) Int. Cl.
 *H01F 7/06* (2006.01)
 *G09B 19/00* (2006.01)
 *G01R 31/28* (2006.01)

(52) U.S. Cl.
 CPC ..... *G09B 19/0069* (2013.01); *G01R 31/2834* (2013.01)

(58) Field of Classification Search
 CPC .......................... G09B 19/0069; G01R 31/2834
 See application file for complete search history.

(56) References Cited

U.S. PATENT DOCUMENTS

| | | | |
|---|---|---|---|
| 7,112,969 B1* | 9/2006 | Thomas | G01R 31/58 324/503 |
| 7,757,936 B2* | 7/2010 | Aguren | H04B 10/0775 235/375 |
| 8,233,804 B2* | 7/2012 | Aguren | H04B 10/2575 398/135 |
| 9,225,539 B2* | 12/2015 | Aguren | H04L 41/12 |
| 10,834,820 B2* | 11/2020 | Rooyakkers | H04L 63/0869 |

* cited by examiner

*Primary Examiner* — Paul D Kim
(74) *Attorney, Agent, or Firm* — BENOIT & COTE INC.; Charles-Andre Caron

(57) ABSTRACT

There is described a method for assembling or repairing an electrical cable in an environment. The method comprises obtaining a unique identifier of an origin connector of the electrical cable to be assembled or repaired. A computing device receives a reading of the unique identifier of the origin connector of the electrical cable to be assembled or repaired and identifies a connection between the origin connector of the electrical cable to be assembled or repaired and a destination electrical component. At the computing device, there is made a determination of the connection that was identified with a connectivity list required for the electrical cable, from a database, to determine a next step of the assembling or the repairing which depends on the connection identified by the computing device.

18 Claims, 19 Drawing Sheets

| | Mate In | Model | Tag | Alias |
|---|---|---|---|---|
| 1 | 601 | 26482 - 2 - MS3475 - 16 | A-26P | |
| 2 | 601 | 26482 - 2 - MS3475 - 16 | B-6S | P1 |
| 3 | 601 | 264... | | P2 |
| 4 | 601 | 38999 - 3 - D38999/26 - 13 | D-35P | |
| 5 | 601 | 38999 - 3 - D38999/26 - 13 | E-35S | |
| 6 | 601 | Custom - 1 - 0 - 1 | F-Blue | |
| 7 | 601 | Custom - 1 - 0 - 1 | G-Green | |
| 8 | 601 | Custom - 1 - 0 - 1 | H-Yellow | |

METHOD FOR ASSEMBLING OR REPAIRING A CONNECTORIZED ELECTRICAL EQUIPMENT IN AN ENVIRONMENT

CROSS-REFERENCE TO RELATED APPLICATIONS

This application is a continuation of U.S. Pat. No. 16,208,743, filed Dec. 4, 2018, now U.S. Pat. No. 11,205,353, which is a continuation-in-part application of U.S. patent application Ser. No. 15/680,490, filed Aug. 18, 2017, now U.S. Pat. No. 10,705,135, which claims benefit of U.S. patent application Ser. No. 14/230,955 filed Mar. 31, 2015, now U.S. Pat. No. 9,817,942, which claims priority of U.S. provisional patent application 61/806,899 filed Mar. 31, 2013, the specification of which is hereby incorporated herein by reference in its entirety.

BACKGROUND

(a) Field

The subject matter disclosed generally relates to automated testing equipment for connectorized electrical equipment, and to the connectorized electrical equipment.

(b) Related Prior Art

Electrical tests and maintenance of electrical equipment are performed using portable handheld testers such as multimeters and automated test equipment (ATE) such as wiring analyzers and other bench testers to perform validation of integrity or functional tests.

One of the main drivers for the type of equipment to use is the availability of interface cables to connect to the various connection points of the subject under test (SUT) on a timely basis with the nature of the test or maintenance to be performed. The limitations in the performance of existing handheld testers and ATEs are mostly related to the ability of a technician to use them efficiently to deliver or return to service the SUT. The handheld testers are generally very agile as they can be used on any connection point using generic probes on specific connections, but are limited in the scope of work that can be performed by a technician who is testing only a few test points at a time. The ATEs are more efficient for their ability to carry a series of test programs on a large number of test points, but they require a large number of customized interface cables to interconnect to the SUT.

The level of agility of existing testers is dependent upon the following factors:
  Scope of test/maintenance:
  Diversity of connector models used on equipment SUT;
  Diversity of test procedures and signals required for the test of maintenance;
  Number of interconnection points to be tested at the same time;
  Planning of test/maintenance:
  Many weeks are generally available to plan the construction of interface cables and test programs for an activity of quality control testing of a production or recurring maintenance;
  Maintenance of unexpected electrical failures requires immediate action to carry on all test procedures as soon as possible to return the SUT to service; time is of the essence and planning is inexistent to provide the technician with all the interface cables at the location of the SUT unless they were effectively built in advance and stored at this particular location;
  Financial considerations are always an important consideration to determine if the interface cables should be built in advance in anticipation of a maintenance/failure activity:
  Engineering costs to create and to design an interface cable layout between the ATE and SUT;
  Costs to build the interface cable;
  Programming costs to integrate the interface cable into the ATE library of tests;
  Programming costs to create the test program;
  Opportunity costs of the operator of the SUT to wait for the interface cable to be able to use the ATE to make urgent repairs. Considering all these factors, there is a need to have a flexible method to design, build and deploy to the location of the SUT all of the interface cables and the test program required for a technician to use an ATE to carry on the full scope of test/maintenance to return the SUT to service, and avoid costs associated with delays and erroneous troubleshooting due to limited test equipment availability. The same may also apply to electrical cables and connectorized electrical equipment that are being tested, or that are being assembled. If electrical cables are determined as being faulty upon testing them, urgent repairs need to be made (e.g., they should be replaced). However, the faulty part of electrical equipment is not always available on the spot, causing unpredictable delays.

Furthermore, ATEs are conventionally used in very limited manufacturing applications such as quality control testing of the integrity of electrical circuits and functional tests and in very limited maintenance applications such as troubleshooting and locating electrical faults.

SUMMARY

Present Mode of Operation is an ATE with construction-oriented interface cables and test programs. Consequently, the ATE described herein is based on universal connector database for GUI-oriented mates and test programs that will be serialized to track usage and functions.

According to an embodiment, there is provided a method to create universal mating interface cables and test programs rapidly using a centralized database containing the library of all types and models of connectors that can then be used graphically to create test programs, and with the ability to be remotely operated to create, validate and track all the mating interfaces and test programs required for immediate assistance at any location in the world.

In an aspect of the invention, there is provided a method for building a part for use with a test equipment in the performance of a test of electrical equipment, the part comprising at least one of a connector, an interface cable, and a test program, the method comprising: accessing a database comprising data about the part, the data being sufficient for at least one of determining an availability of the part and allowing building the part; building the part based on the data; and providing the part with a unique identifier.

According to an embodiment, the method further comprises, prior to accessing a database, identifying all parts that are required for the performance of the test.

According to an embodiment, the method further comprises identifying all parts that are not available for the testing of electrical equipment.

According to an embodiment, the method further comprises, with the unique identifier, validating the identity of the part as usable in a regulated context.

According to an embodiment, accessing a database comprises accessing, through a communication network, a centralized database which is remote from a location at which the testing is performed.

According to an embodiment, accessing a database comprises performing a financial transaction to permit access to the data allowing building the part.

According to an embodiment, building a part based on the data comprises building a connector shell using a 3D printer.

According to an embodiment, building a part based on the data comprises building a connector using a printed circuit board and standard contacts.

According to an embodiment, building a part based on the data comprises obtaining existing parts and assembling them into an interface cable.

According to an embodiment, the method further comprises, prior to building a part, accessing an inventory management module for informing a user about the availability, at a given location, of the existing parts for an interface cable.

According to an embodiment, building a part using the data comprises generating a test program in accordance with an actual configuration of the testing equipment.

According to an embodiment, generating a test program comprises generating a test program based on a graphical representation of the test equipment.

According to an embodiment, the method further comprises saving the unique identifier in the database for a future use.

In another aspect of the invention, there is provided a system for building a part for use with a test equipment, the system comprising: an inventory management module for informing about the availability, at a given location, of the part; a library comprising data about the part, the data being sufficient for allowing a building thereof; and a communication infrastructure for communicating the data about the part to a location at which the testing is performed for allowing the building of the part.

According to an embodiment, the system further comprises a graphical user interface (GUI) to allow a user to access the library and the inventory management module.

According to an embodiment, the communication infrastructure is further for sharing information between the GUI, the library and the inventory management module.

According to an embodiment, the library and the inventory management module are comprised in a centralized database which is remote from a location at which the testing is performed.

According to an embodiment, the communication infrastructure is for communicating information between the centralized database and the location at which the testing is performed.

According to an embodiment, the system further comprises an assembly kit which comprises a printed circuit board and subparts for building the part of test equipment.

According to an embodiment, the system further comprises a 3D printer for building the part of test equipment at least in part.

According to an embodiment, the library comprising data about connectors comprises at least one of: connector layout, drilling positions, connector dimensions, types and models of contacts, types and models of shells.

According to an embodiment, the system further comprises a computer for building a test program for running the test equipment.

There is herein described a system to use an automated test equipment (ATE) to assist in building and repairing connectorized electrical equipment. The potential advantages of such a system is to increase the operational capabilities of ATE to create manufacturing and/or maintenance documents, track the progression of the connectorized electrical equipment being manufactured or repaired, accelerate the manufacturing and/or maintenance activities with automation, all those activities being prior to the quality control validation tests that were already being performable by the ATE. Further benefits include faster production schedule, better management, lower costs and better return of investment on the productivity from the ATE. In fact, this new paradigm will also provide opportunities to upgrade the design of existing electrical equipment by providing new methods to assemble them more rapidly and at lower cost, as well as to maintain them faster and at lower cost, using the proposed ATE. For example, an electrical control panel currently being installed in a ship is built on the ship with the metal box being fixed to a wall, components installed on-ship into the box, cables are installed on the ship with wire terminations screwed in the electrical box component at each end. The process is done in a very hard-working environment, requires extensive manual testing and provides limited opportunities for automated maintenance. With the proposed ATE, the manufacturer could redesign the electrical control panel with connectors, providing opportunities to build the control panel and the electrical cables required to interconnect the electrical systems in a ship, as well as providing opportunities to accelerate the manufacturing of modular panels and modular cables in manufacturing facilities with an environment better suited for manufacturing than a ship. Once these modules are transferred and installed on the ship, the can be further completed and tested on the ship individually or as an integrated electrical sub-system, both at the manufacturing level of the ship, but also for its maintenance over the life of the ship. The proposed ATE therefore provides opportunities to reduce the total cost of ownership of the ship electrical sub-system over the life of the ship. This also applies to aircraft, trains, housing, etc.

According to an aspect of the invention, there is provided a method for assembling a connectorized electrical equipment, the method comprising:
  providing a connectivity list required for the connectorized electrical equipment, comprising an origin connector and an identifier thereof, a destination electrical component and an identifier thereof; and a list of connections between the origin connector and the destination electrical component;
  querying a database comprising a library of electrical components with the connectivity list;
  generating a construction plan for the connectorized electrical equipment, the construction plan comprising an illustration of connections to be performed for assembling.

According to an embodiment, there is further provided: based on the construction plan, providing instructions for a connection between the origin connector and the destination electrical component.

According to an embodiment, the instructions comprise an illustration of at least one of the origin connector and the destination electrical component, in which the connection between the origin connector and the destination electrical component is highlighted.

According to an embodiment, there is further provided:
  connecting an ATE to the origin connector of the electrical equipment to be assembled;

identifying the connection between the origin connector and the destination electrical component using the ATE for tracking; and providing assembly instructions.

According to an embodiment, there is further provided:

based on the tracking, updating an assembly status to automatically provide updated instructions for the connection between the origin connector and the destination electrical component according to the construction plan; and repeating steps of providing instructions, identifying and updating until completion.

According to an embodiment, there is further provided validating the connectorized part of electrical equipment.

According to an embodiment, there is further provided generating a list of components required for assembling the connectorized electrical equipment.

According to an embodiment, there is further provided:

in an inventory database, identifying components that are not available; and manufacturing the components that are not available using a 3D printer.

According to another aspect of the invention, there is provided a method for maintaining electrical equipment, the method comprising:

performing a test of the electrical equipment using a test equipment connected to the electrical equipment;

as a result of the test, identifying a faulty part of the electrical equipment;

accessing a database comprising data about the electrical equipment, the data being sufficient for identifying sub-parts of the faulty part that are required for building the part; and providing visual instructions for building the part of electrical equipment based on the data by assembling the sub-parts.

According to an embodiment, there is further provided determining an availability of the sub-parts of the faulty part that are required for building the part.

According to an embodiment, building the part based on the data further comprises building one of the sub-parts or the part using a 3D printer.

According to an embodiment, building the part based on the data comprises building a connector shell using a 3D printer.

According to an embodiment, building the part based on the data comprises building a connector using a printed circuit board and standard contacts.

According to an embodiment, building the part based on the data comprises obtaining existing sub-parts and assembling them into the part of electrical equipment. This can be done by using augmented reality technology to provide a visual aid to assist technician as to the routing of the wiring, or to precisely position contacts into the proper termination of the connectorized part.

According to an embodiment, there is further provided: providing the part of electrical equipment with a unique identifier.

According to an embodiment, there is further provided, with the unique identifier, validating an identity of the part as usable in a regulated context, or saving the unique identifier in the database for a future use.

According to an embodiment, accessing a database comprises accessing, through a communication network, a centralized database which is remote from a location at which the testing is performed.

According to an embodiment, accessing a database comprises performing a financial transaction to permit access to the data allowing building the part.

According to an embodiment, there is further provided, prior to building a part, accessing an inventory management module for informing a user about the availability, at a given location, of existing parts or sub-parts.

According to an embodiment, the part comprises at least one of: a wire harness, a connector of a wire harness, and an electrical component of a connectorized electrical equipment.

Furthermore, a visual aid taking advantage of augmented reality technology can be implemented to provide an efficient, paperless building technique that will save time. The augmented-reality visual aid can explicitly show to the technician, by visual superimposition, the routing of the wiring to manufacture, repair or test. It can further show precise positioning of contact into the proper termination of the connectorized part, again, by visual superimposition.

A virtual reality apparatus can also be used as a visual guide to the technician, especially in order to show explicitly to the technician, by visual superimposition, the routing of the wiring to manufacture, repair or test.

According to an embodiment, there is provided a method for assembling or repairing a connectorized electrical equipment in an environment, the method comprising: —connecting an Automated Test Equipment (ATE) to an origin connector of the connectorized electrical equipment to be assembled or repaired, for tracking connections; —identifying a connection between the origin connector and a destination electrical component using the ATE; —at a computing device, receiving the connection identified by the ATE; —at the computing device, comparing the connection identified by the ATE with a connectivity list required for the connectorized electrical equipment to determine a next step of the assembling or the repairing which depends on the connection identified by the ATE; —generating a visual aid representative of the next step and outputting the visual aid to an apparatus which provides, to a user, the visual aid superimposed with the environment or in a virtual environment.

According to an aspect, the method for assembling or repairing a connectorized electrical equipment further comprises: —based on the tracking, updating an assembly status to automatically provide updated instructions for a connection between the origin connector and the destination electrical component according to the construction plan until completion.

According to an aspect, the connectivity list for the connectorized electrical equipment comprises an origin connector and an identifier thereof, a destination electrical component and an identifier thereof; and a list of connections between the origin connector and the destination electrical component.

According to an aspect, the method for assembling or repairing a connectorized electrical equipment further comprises: —querying a database comprising a library of electrical components with the connectivity list; —generating a construction plan for the connectorized electrical equipment; —generating, from the construction plan, instructions and illustrations of connections to be performed for assembling.

According to an aspect, the visual aid comprises an illustration of at least one of the origin connector and the destination electrical component, in which a connection between the origin connector and the destination electrical component is highlighted.

According to an aspect, generating the visual aid to an apparatus comprises outputting the visual aid to an augmented reality apparatus which provides the visual aid superimposed with the environment.

According to an aspect, generating the visual aid to an apparatus comprises outputting the visual aid to a virtual reality apparatus which provides the visual aid in a virtual environment.

According to an aspect, outputting the visual aid comprises outputting a personalized visual aid to a plurality of apparatuses.

According to an aspect, the method for assembling or repairing a connectorized electrical equipment further comprises: —generating a list of components required for assembling the connectorized electrical equipment; —in an inventory database, identifying components that are not available; and —manufacturing the components that are not available using a 3D printer.

According to an aspect, the current state of the connectorized electrical equipment in the environment is obtained by a camera or a sensor on the apparatus.

According to an embodiment, there is provided a method for testing a connectorized electrical equipment in an environment, the method comprising: —at a computer, receiving a result of a test of the connectorized electrical equipment performed by a test equipment connected to the connectorized electrical equipment; —comparing the result with a test program to identify a faulty part of the connectorized electrical equipment to generate a visual aid for a next step of the maintaining; —outputting the visual aid to an apparatus which provides, to a user, the visual aid superimposed with the environment or in replacement of the environment to locate the faulty part.

According to an aspect, the test equipment is a test box unit of an automated test equipment.

According to an aspect, outputting the visual aid comprises outputting a personalized visual aid to a plurality of apparatuses.

According to an aspect, the method for testing a connectorized electrical equipment further comprises: —accessing a database comprising data about the connectorized electrical equipment, the data being sufficient for identifying sub-parts of the part identified as faulty that are required for building the part and —providing the visual aid with the apparatus also for building a part of connectorized electrical equipment based on the data by assembling the sub-parts.

According to an aspect, building the part based on the data comprises building one of: —a connector shell using a 3D printer; and —a connector using a printed circuit board and standard contact.

According to an aspect, the part comprises at least one of: a wire harness, a connector of a wire harness, and an electrical component of a connectorized electrical equipment.

According to an aspect, providing the visual aid is performed using an apparatus for augmented reality.

According to an aspect, providing the visual aid is performed using an apparatus for virtual reality.

As will be realized, the subject matter disclosed and claimed is capable of modifications in various respects, all without departing from the scope of the claims. Accordingly, the drawings and the description are to be regarded as illustrative in nature, and not as restrictive and the full scope of the subject matter is set forth in the claims.

BRIEF DESCRIPTION OF THE DRAWINGS

Further features and advantages of the present disclosure will become apparent from the following detailed description of selected embodiments, taken in combination with the appended drawings, in which:

FIG. 6 is a screenshot illustrating a selection panel in which a connector or electrical part in the library can be selected, according to an embodiment;

It will be noted that throughout the appended drawings, like features are identified by like reference numerals.

DETAILED DESCRIPTION

Figure 1:
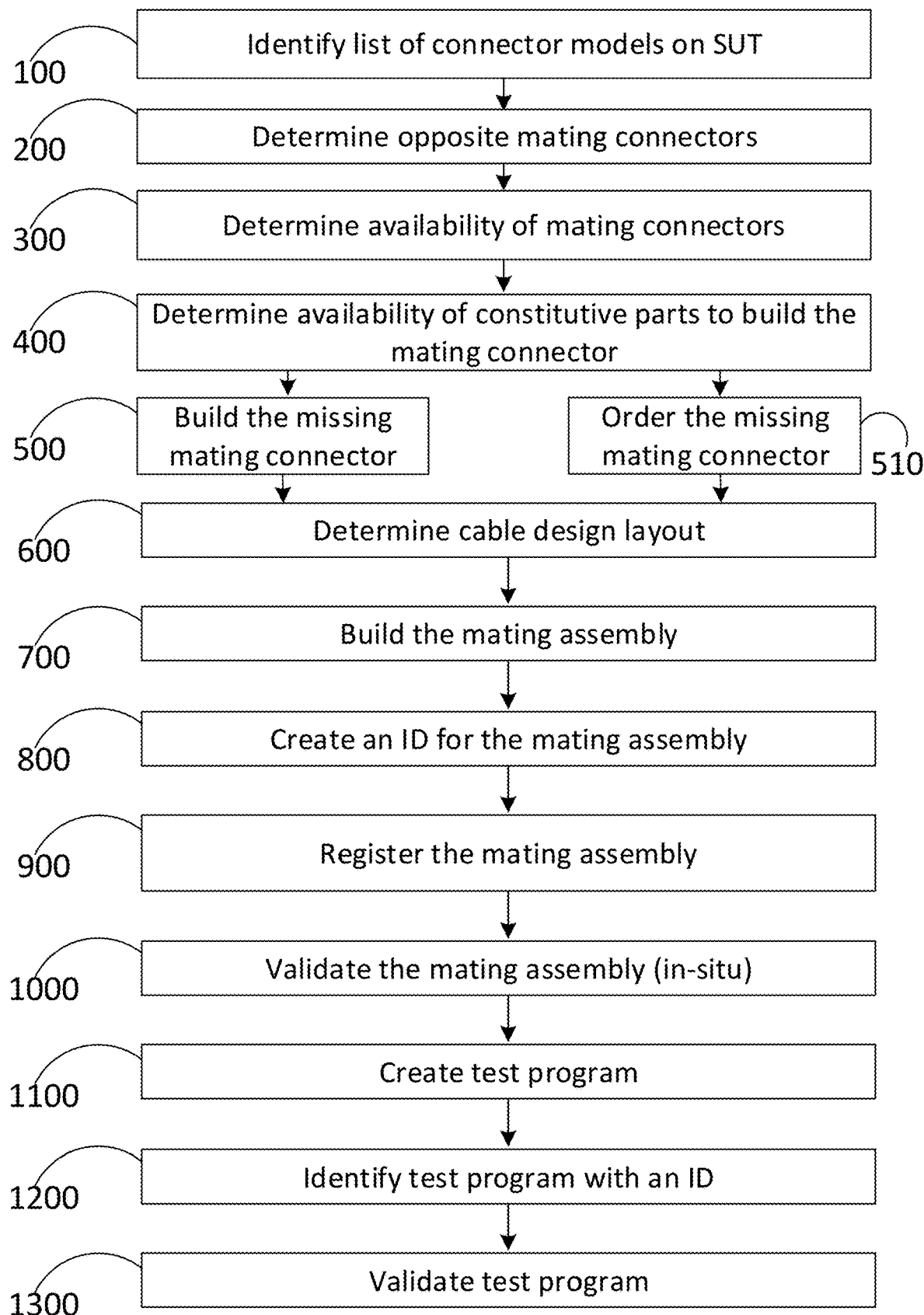
FIG. 1 is a flowchart of a method for creating universal mating cables and related testing programs, according to an embodiment.

When, at the beginning of or during a testing of electrical equipment, it is noted that a part of test equipment is faulty, missing or incomplete, there is a need to fulfill this need promptly. The same applies to a part of electrical equipment to be tested, since the inability to repair or replace a faulty part of electrical equipment may have the same effect of delaying the workflow, and postponing the moment when the electrical equipment is put back in service. The electrical equipment may comprise electrical cables, electrical harnesses, electrical components such as relays, coil, control panels and all sorts of parts in a connectorized electrical equipment. The term "connectorized" electrical equipment encompasses electrical equipment which have at least one connector, with wires connected thereto. The connectorized electrical equipment may comprise a mix of parts such as wire harnesses, or pair of connectors with wires connected therebetween, or a connector having wires extending to other components or electrical ground, or a connector connectable to a printed circuit board, or electrical components connected with other electrical equipment, etc.

There is described a method for finding the faulty or missing part at a nearby location, using a system 1 comprising an inventory management module 13 accessible through a communication network 20, and/or for building the missing part of connectorized electrical equipment, including equipment being tested or equipment to be manufactured, using the data necessary for its manufacture. Such data can be found in a specialized library 11 (which comprises information on connectors and any electrical component with contacts) which is accessible through the communication network 20. The library 11 and the inventory management module 13 can be embedded in a remote centralized database, which ensures common knowledge among the various subscribers, and helps serializing and validating the parts that are built using the method presently described to make sure that the connectorized electrical equipment, such as test equipment, was made and is used by approved entities. According to embodiment, users can use the method through a GUI 12 (e.g. a website, a software application and the like).

When a given part of testing equipment is missing, instead of waiting for days of weeks to receive it (and pay the high price), it is possible to find the missing part if it is located nearby, to find the constitutive pieces that can be assembled into the part that is missing, or to build the part completely using data about the materials, dimensions and configuration. In-situ building of parts can be performed in various ways, such as assembling of available fundamental parts or subparts by a working crew, and/or manufacturing it at the test location using customized manufacturing means such as a 3D printer.

The terms "part of testing equipment" is to be understood as comprising both physical parts, such as interface cables and specific connectors (both connectors that mate with the subject under test or with the automated test equipment), and virtual parts, such as test programs that may be needed to run a given test. Just like physical parts, test programs can be missing, and they need to be generated and validated prior to using them for testing a harness.

The terms "connectorized electrical equipment" is to be understood as comprising physical parts of any electrical equipment being manufactured or tested, including the testing equipment or the electrical equipment of the SUT, for example, and comprising at least one origin connector (to which the ATE can be connected). This includes electrical cables of the SUT, electrical connectors of the SUT, electrical components and accessories within the electrical equipment of the SUT, electrical panels, control panels, motors, actuators, relays, passive components and the like. According to an embodiment, the electrical equipment to be tested comprises wire harnesses, such as those used in aircrafts, ships or trains, or other types of cables having interconnections between them, or electrical sub-system with connectorized electrical components such as electrical panels, control panels, motors, actuators, relays passive components and the like. The cables that are bundled in harnesses can be repaired or changed individually or together. The connectorized electrical equipment can be repaired or changed with individual internal components (i.e., subparts) or as a whole.

As shown in FIG. 1, the steps to build interface cables are as follows:

Identify list of connector models on the SUT (step 100);

For each connector identified in step 100, determine the opposite mating connector (step 200);

Determine if the mating connector in step 200 is available on an existing interface cable in the inventory (step 300);

If none are found in step 300, determine if the parts to build such an interface connector are available (step 400). Generally, planning can be made in advance for the virgin interface cable that includes the ATE standard mating connector and sufficient wire to connect to the SUT mating connectors. The present description relates to the mating connector parts such as connector main shell, contacts and backshell;

If the parts in step 400 do not exist, there will be a need to rapidly:
  a. Order the parts required (step 510) and proceed to step 600 once available; this will inevitably involve delays in terms of days or weeks;
  b. To reduce delays, build the required mating connector (step 500) with a process that uses standard contacts that can be inserted into either:
    i. a pre-build templates representation of the mating connector such as printed circuit boards; or
    ii. a database-based program to manufacture the connector using a 3-D printer or other rapid method;
    iii. a combination of manufacturing means (e.g. 3D printer) for building missing subparts (such as connectors shells or other non-metallic subparts) and electric assembling kit (for assembling the standard contacts with the newly built connector shells, for example).

Determine the required mating interface cable design layout (step 600) that will link each of the connection points on the ATE standard connector identified in step 400 with a specific mating wire to the appropriate connection point on the mating connector, either by:
  a. An engineering drawing determining such design;
  b. A standard database identifying the layout of such design;

Physically build the mating assembly consisting of the ATE mate connector, wires and opposite mating connector (step 700);

Create an identification for the mating assembly (step 800) so that it can be recognized by an ATE by any or a combination of the following methods:
   a. A standard number for the mating assembly;
   b. A unique serial number to the mating assembly;
   c. Incorporating a medium to read the information about the mating assembly;
      This identification method can be performed manually or it can be created using a database Except if incorporating a medium was performed, the final mating assembly must be registered (step 900) so that it can be recognized by the ATE for it to be able to use it on the SUT. This can be performed manually or can be created by a software in various ways, including:
   a. Adding the mating assembly to the ATE library the design layout of the mating assembly;
   b. Adding the mating assembly to a standard database;

Once recognizable by the ATE as described in step 900, the mating assembly can be shipped to the location where it is needed by the technician for the test/maintenance on the SUT, and at that point, it will generally need to be validated (step 1000) prior to the first utilization to make sure that it respects the specifications of connector on the SUT and that it was made by an approved vendor;

Another step generally required to operate the ATE is creating a test program (step 1100) that incorporates one or many interface mating cables and requires engineering or technician skills to ensure that the test signals sent to the SUT are appropriately sequenced on the specific connection points of any or all of the connectors. Such programs are generally done by any of:
   a. The organization responsible for the test/maintenance;
   b. The ATE manufacturer;
   c. Approved vendors;

The test program must also be identified (step 1200) in a matter similar to step 800;

The test program must also be delivered to the location of the test/maintenance and validated (step 1300) prior to its first utilization to ensure that it respects the specifications of the test requirements and that it was made by an approve entity listed in step 1100.

Figure 2:
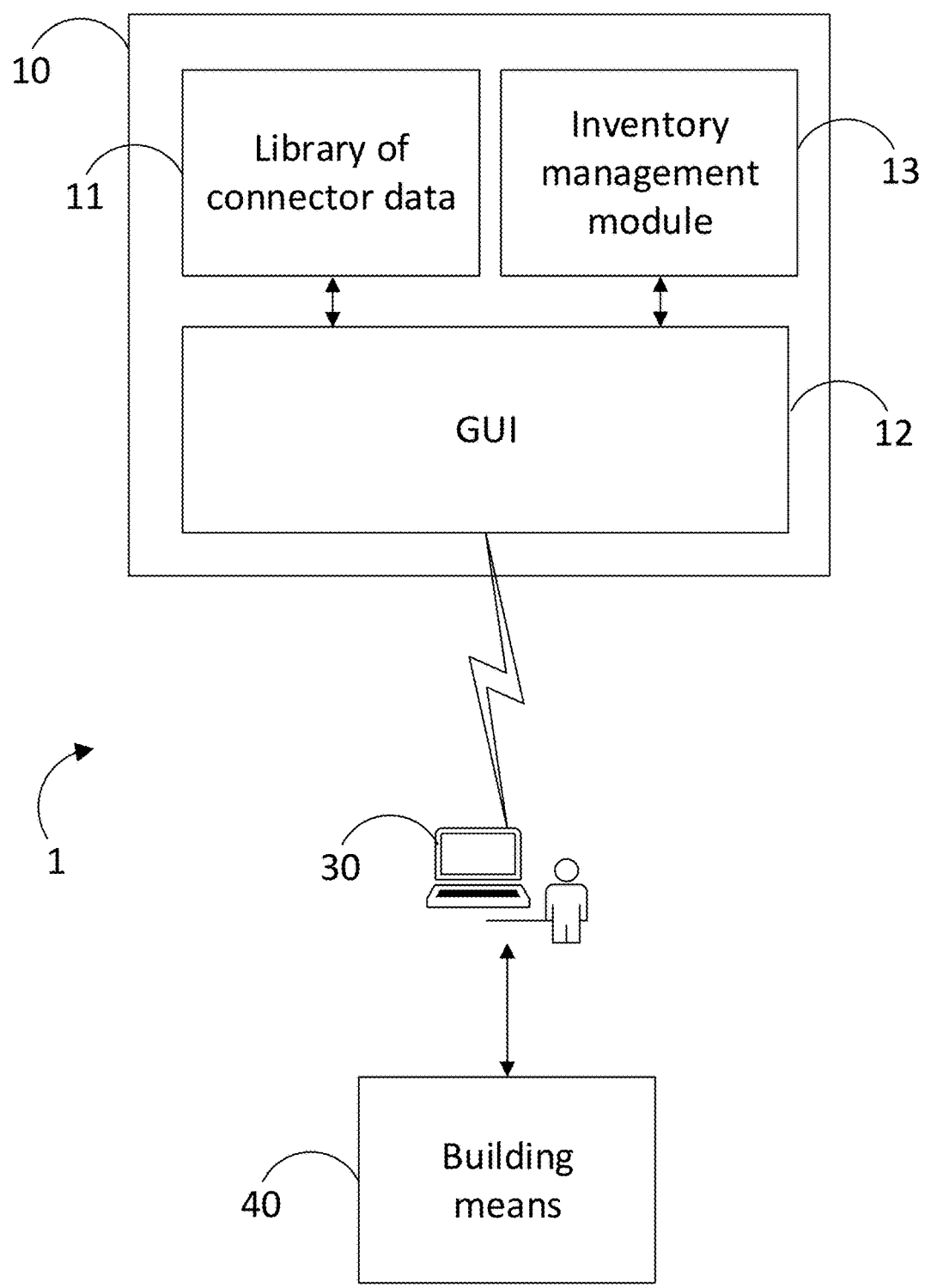
FIG. 2 is a block diagram showing the system for creating connectorized electrical equipment, including universal mating cables, and related testing programs, according to an embodiment.

According to an embodiment, in order to perform the above-noted steps in the most productive way, the novel system 1, which allows many of these steps to be performed programmatically at least in part, consists in the following: a centralized database 10, a library 11, an inventory management module 13, and a communication infrastructure 20, as illustrated in FIG. 2.

The centralized database 10 that has the ability to create, support, validate and track any of:
   Library 11 of all types and models of connectors and their subparts, as well as various electrical components with contacts, with details as to:
      Physical layout and dimensions to support mechanical reproduction such as 3D printers or printed circuit boards, including drill out positions for the insert contacts;
      Graphical layout of contact positioning and numbering/lettering;
      Family type and opposite mating connectors and/or electrical components;
      Types and models of contacts;
      Types and models of backshell;
      Any other information as required;
      This information can be used to feed 3D printing or to feed augmented reality processes, whether for routing or connection terminations;
   Graphical tools 12 to support the production of an interface cable or a connectorized electrical equipment, with details as to:
      Type and model of connector to connect on the ATE side;
      Type, number, layout position, length, number and other details of the wires required to interconnect the connectors and/or electrical components with contacts;
      Type and model of connector and/or to connect on the SUT side;
      Tools and related adjustments required to build the cable interface or the connectorized electrical equipment;
      Identification of the interface cable or connectorized electrical equipment by a serial number, model number, and other relevant information as to its specifications or its use,
      Augmented reality software to show routing and/or connection terminations
   Inventory management module 13 to determine availability at any location of:
      Mating interface cable by serial number or model number;
      Connectors or electrical components by type and model number, whether for the ATE or SUT side;
      ATE test equipment by serial number or model number;
      Test programs by serial number or functional procedure, both in relation to ATE equipment and interface equipment that will be used together;
      Any parts required to build interface cables assemblies, including raw materials and parts to build the connectors and/or the wiring parts of the cables;
      Any parts required to build the connectorized electrical equipment, including raw material and parts to build the electrical components and/or the other parts thereof.

A communication infrastructure 20 to support internationally in real-time the operations that will be required to exchange the information between the central database 10 and the location at which the part for testing are needed for the test to be performed, thereby allowing the system 1 to:
   Find, within an inventory, existing interface cables, test programs, ATE equipment or parts as described previously;
   Create an interface cable or a test program and provide it with a unique identification number;
   Validate the configuration and identity of a cable interface and/or test program;
   Support any other technical function in relation to interface cables or test programs or other accessories in relation to electrical testing;
   Support any administrative and financial operations in relation to the cable interface or test programs, including services such as rental, pay-by-use, license fee or other type of services.

The user can access the system 1 through a computer 30 which is connected with the communication infrastructure 20. Such communication infrastructure 20 can be of any form, including network or cloud computing. If parts of test equipment are to be built, building means 40, such as 3D printer, electronic kit (printed circuit board and electronic basic parts and contacts) and the like. If the part to be built is a test program, the building means 40 is rather a computing device performing specific instructions to create a test program. These instructions can be performed on the in-situ computer 30, or on another computer accessed through the communication infrastructure 20. According to an embodiment, generating the test program is made through the GUI 12. For example, the user can specify, using a graphical representation of the connector layout, which links in the harness have to be tested. Further, the user can use augmented reality as described herein.

According to an embodiment, the system 1, since it is implemented on a computer, can programmatically perform many steps at least in part, or it may simply assist a user in performing these tasks much more efficiently, especially for steps 100 to 400, 600, and 800 to 1300. Some of these tasks involved delays in the prior art, and the delays are considerable reduced by the combined use of the database 10, graphical tools 12, inventory management module 13 and communication infrastructure 20. The system 1 further allows performing step 500, namely build a connector with a 3D printer, and consequently, step 700 (building the connector assembly). It should be further noted that step 700 of building the connector assembly can also be done using a virtual reality visual aid on a screen or using augmented reality visual aid using a helmet, glasses or a projector outlining the information on the part.

Serialization (i.e. attributing an ID to the parts that were built, including the test programs) eases remote validation of the newly built parts test equipment. The serial number/ID of the parts or assemblies can be compared to the data in the central database (through the communication network 20). Registration/validation is therefore accelerated by the present system 1.

According to an embodiment, it is possible to perform a financial transaction to obtain the data to build the part.

According to an embodiment, the database contains the ID of parts in various locations. The database 10 thus knows the identity of the parts that can be used for performing a test, which can be useful in regulated contexts in which regulations, legal requirements, best practices or standards are applied, such as in the aircraft maintenance industry. If the parts are detected during the test, the database can be aware of unidentified parts or parts with a falsified ID, therefore identifying counterfeit or stolen parts, an issue which is critical in the industry of aircraft maintenance. It is why an ID which is created using the method presently described is saved in the database so the database knows the existence of the newly built part, knows its ID and knows it is a legitimate part.

Although the steps described above relate to an interface cable used for testing, the steps may also be adapted to relate to any connectorized electrical equipment, such as the SUT being tested or being manufactured. This may therefore include a cable of the SUT being tested, or a connector on the SUT with which the interface cable of the testing equipment will have to mate, or any subset parts of a connectorized electrical equipment being manufactured.

A list of cables, connector models, components or other accessories on the connectorized electrical equipment should be provided. In an exemplary implementation, after testing is done, for example using the ATE as described above, a list of faulty parts of the electrical equipment should be created as a result of the testing, i.e., the parts of the electrical equipment that have been identified as in need to be repaired or replaced should be identified. However, this exemplary implementation applies to the context of testing, not manufacturing.

It should then be determined if the parts of the electrical equipment are available, for example by verifying in a database similar to (or the same as) the database described above, and which would be representative of an inventory of existing available parts of the electrical equipment. If none are found, then it should be determined with the database if the sub-parts to build such parts of the electrical equipment are available.

If the required sub-parts do not exist, there will be a need to rapidly:
  a. Order the parts (or sub-parts to be assembled) required and proceed to the repairs once available; this will inevitably involve delays in terms of days or weeks;
  b. To reduce delays, build the required part of electrical equipment, or missing sub-part(s), with a process that uses available standard sub-parts that can be inserted into either:
    i. a pre-build templates representation of the part of electrical equipment such as printed circuit boards; or
    ii. a database-based program to manufacture the part of electrical equipment using a 3-D printer or other rapid method;
    iii. a combination of manufacturing means (e.g., a 3D printer) for building missing sub-parts (such as connectors or other non-metallic sub-parts such as connector shells of the SUT) and electric assembling kit (for assembling the already available standard sub-parts, such as wiring, with the newly built connector shells of the SUT, for example).

According to an embodiment, this can be done advantageously in situ, i.e., in the testing facility where the testing of the SUT is performed. According to another embodiment, it is rather performed in another facility.

If needed, one should then determine the design layout of the electrical equipment of the SUT being repaired, reworked or built, either by:
  a. An engineering drawing determining such design;
  b. A standard database identifying the layout of such design;

The part of the electrical equipment may then be physically built by assembling together the sub-parts (once they are found in the inventory, or received, or fabricated in situ in the testing facility for example with a 3D printer). This step may also involve repairing the faulty part and thus reuse the part that was present in the electrical equipment.

Advantageously, there can be created an identification for the newly built or repaired part of the electrical equipment so that it can be recognized by an ATE by any or a combination of the following methods:
  a. A standard number for the part of the electrical equipment;
  b. A unique serial number to the part of the electrical equipment;
  c. Incorporating a medium to read the information about the part of the electrical equipment y;
  d. This identification method can be performed manually or it can be created using a database.

Except if incorporating a medium was performed, the final part of the electrical equipment can be registered so that it can be recognized when testing the SUT. This can be performed manually or can be created by a software in various ways, including adding the part of the electrical equipment to a standard database.

Once registered or made recognizable, the part of the electrical equipment can be shipped to the location where it is needed and at that point, it will generally need to be validated, as described above, prior to the first utilization to make sure that it respects the specifications of the SUT and that it was made by an approved vendor.

Figure 3:
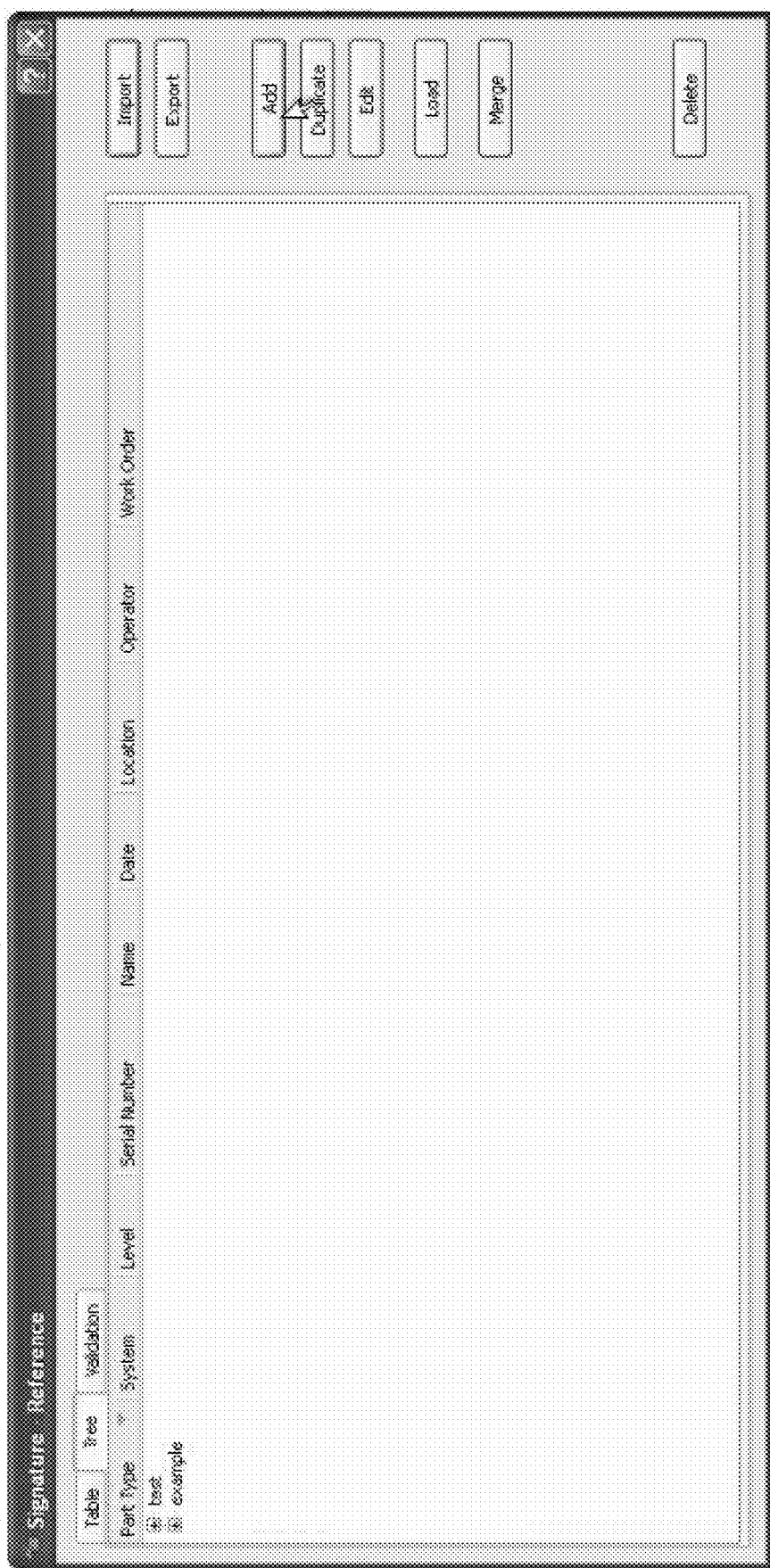
FIG. 3 is a screenshot illustrating a test management panel, according to an embodiment.
Figure 4:
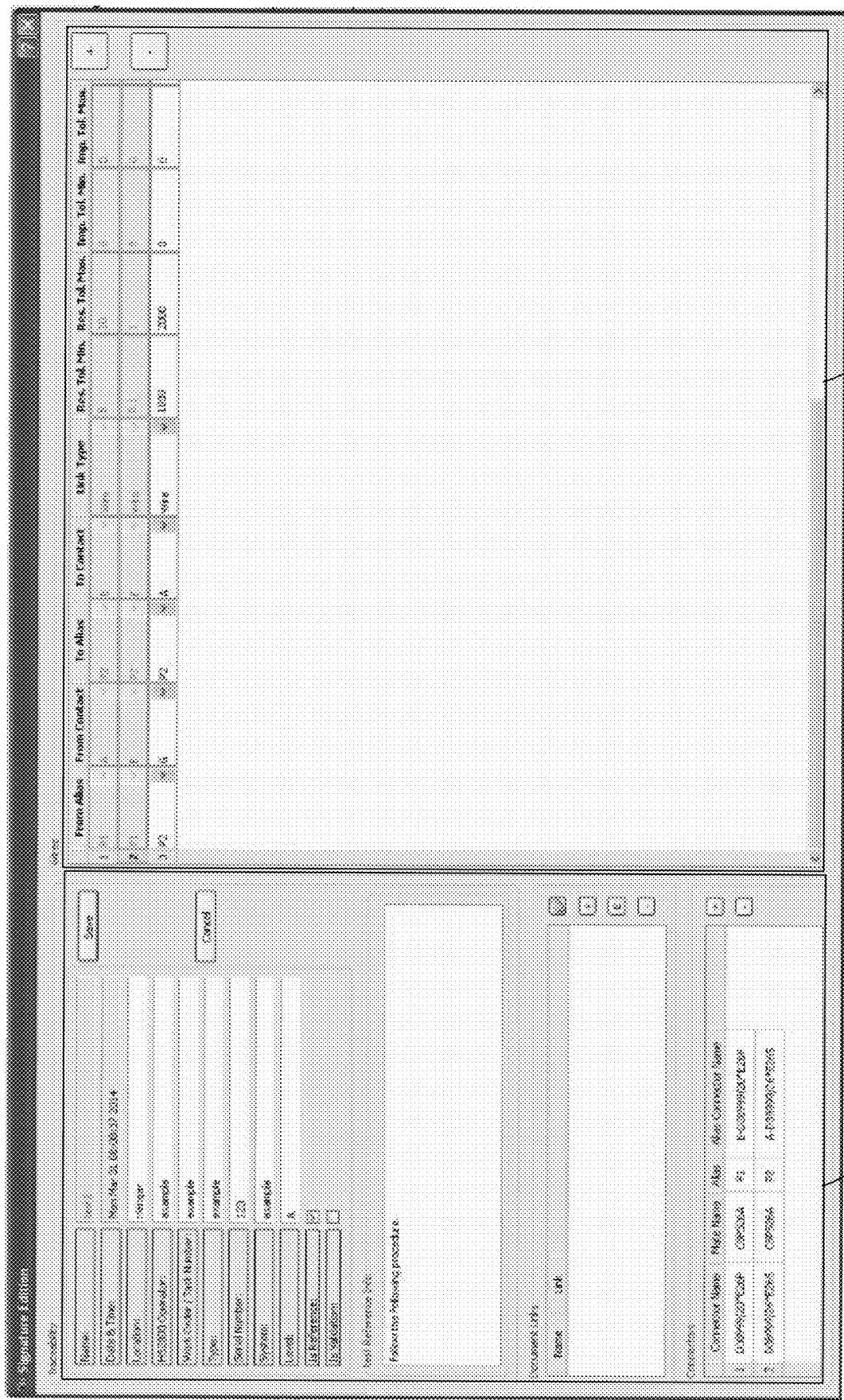
FIG. 4 is a screenshot illustrating an interconnection panel in which a user can define the links to be tested, according to an embodiment.

Now referring to FIGS. 3 and 4, there is shown an interconnection panel 420 in which the user can define the interconnections or links to be tested in a test program, thereby creating a test program. In the example shown in FIG. 4, the links P1-A to P2-B, P1-E to P2-E and P2-G to P2-A are defined so that they will be tested. A specification panel 410 allows the user to specify details (date, operator, name of the test, serial number, location, etc.) about the test to be performed. Supplemental information can be provided and the details of the test can be saved. FIG. 3 shows a test management panel 310 in which tests programs can be imported or exported, added or deleted, merged, duplicated and edited.

Figure 5:
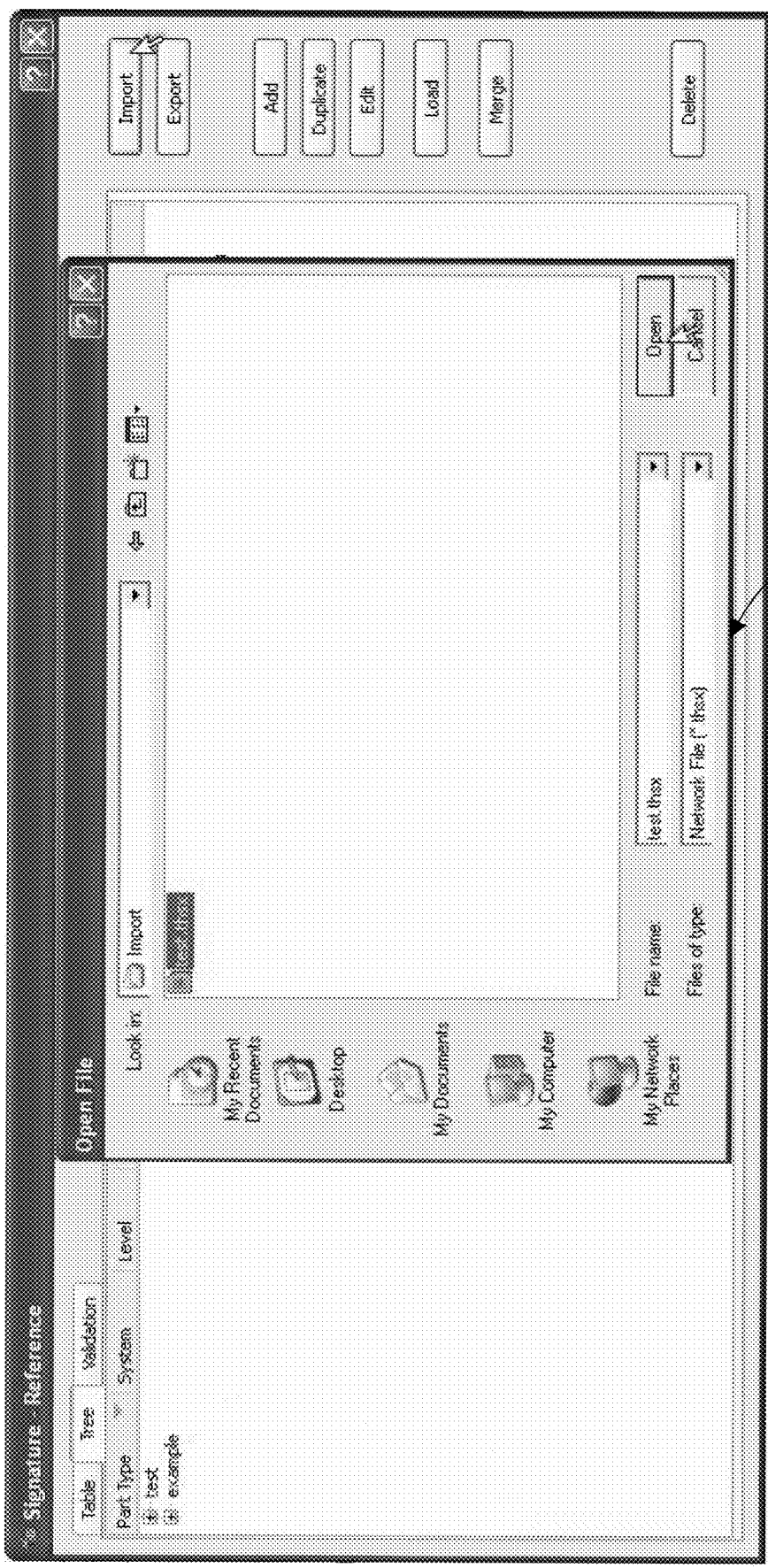
FIG. 5 is a screenshot illustrating a test management panel through which an importation panel is called, according to an embodiment.

FIG. 5 shows the test management panel 310 through which an importation panel 520 was called, thereby allowing importing a specific file which contains test program instructions.

Figure 7:
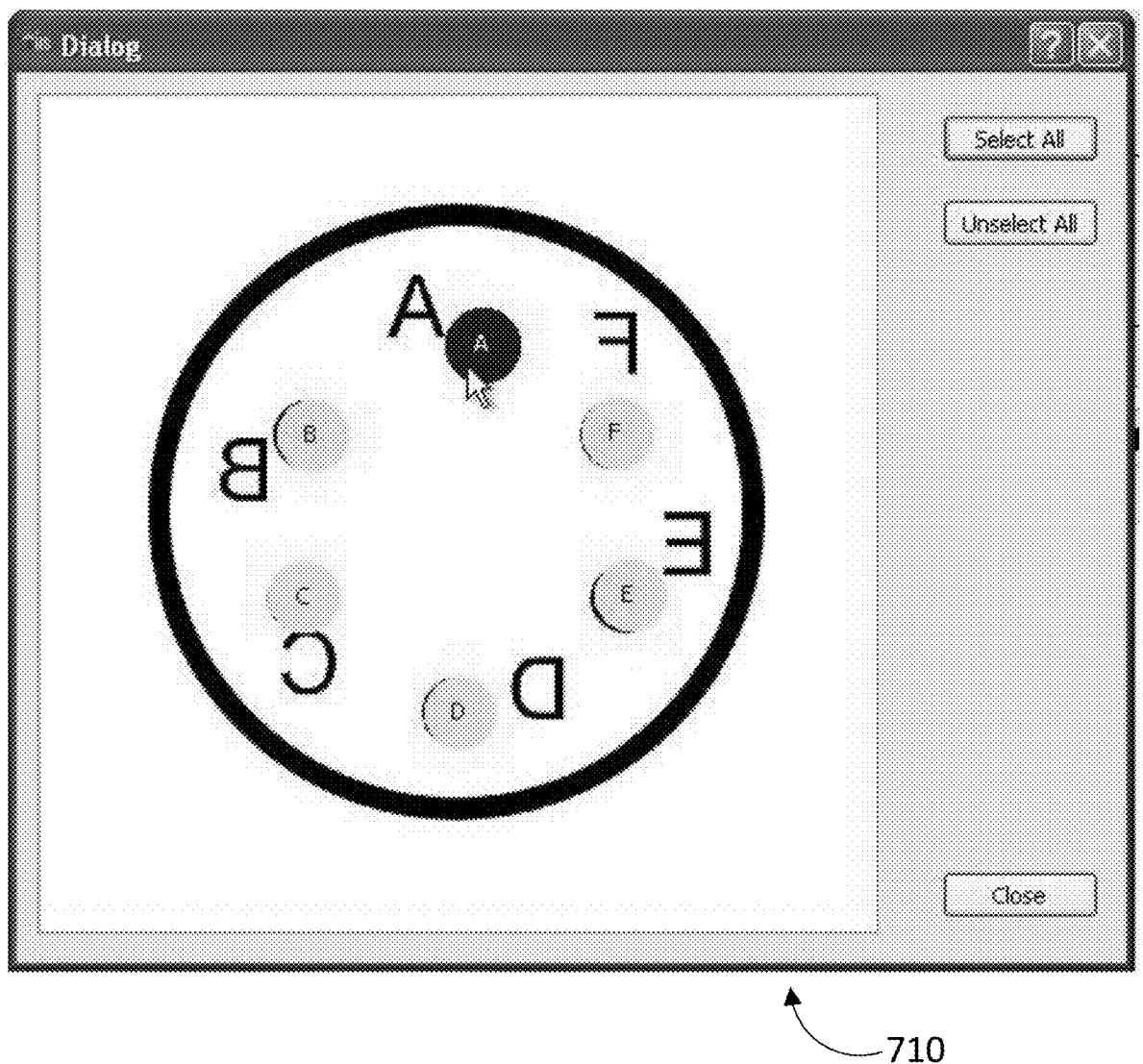
FIG. 7 is a screenshot illustrating a graphical interface for selecting contacts, either those of a connector or those of another type of electrical component with contacts, to be tested for the performance of a test, according to an embodiment.

Now referring to FIGS. 6 and 7, there is shown a graphical interface for selecting contacts to be tested for the performance of a test. FIG. 6 shows a selection panel 610 in which a connector can be selected. When a connector is selected, a graphical representation of the connector can be displayed, as in the connector display interface 710 shown in FIG. 7. The connector display interface 710 allows the user to select or unselect one or many contacts to be tested in the connector.

Figure 8:
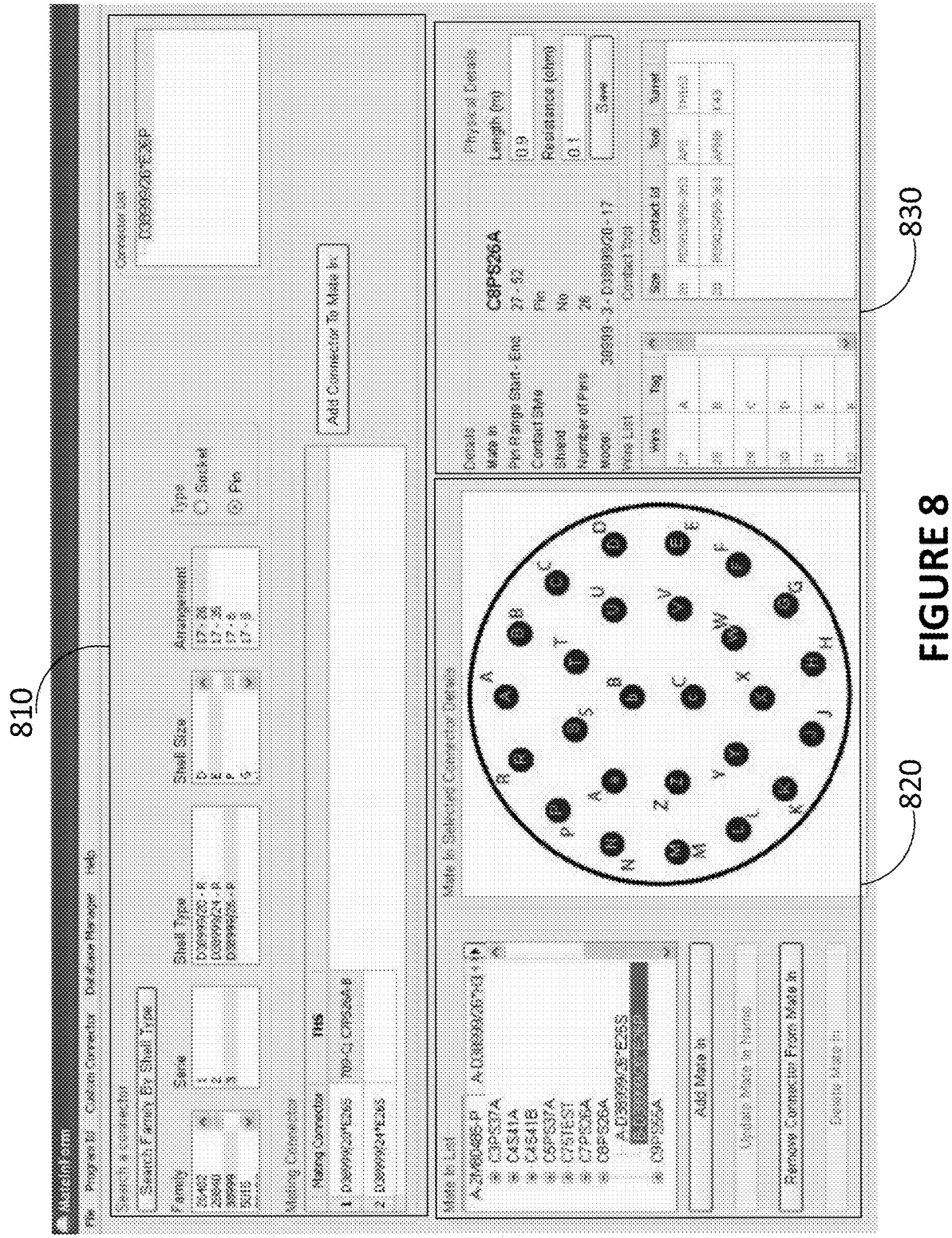
FIG. 8 is a screenshot illustrating an interface for adding a connector or an electrical equipment to a mate-in list, according to an embodiment.

While FIGS. 3 to 7 were directed to a part of equipment comprising a test program, FIG. 8 is directed to a part of equipment comprising a connector having contacts. FIG. 8 shows an interface for adding a connector to a mate-in list. Connector addition panel 810 allows the user to add a new connector to the test equipment. According to an embodiment, the user can choose a family, serial number, shell type and size, arrangement and whether it is a pin or a socket. Connector positioning panel 820 allows the user to place the newly created connector at the right place in the layout. If necessary, the connector can be physically built in parallel in accordance with the steps described above. A detail box 830 provides details about the chosen connector.

Figure 9:
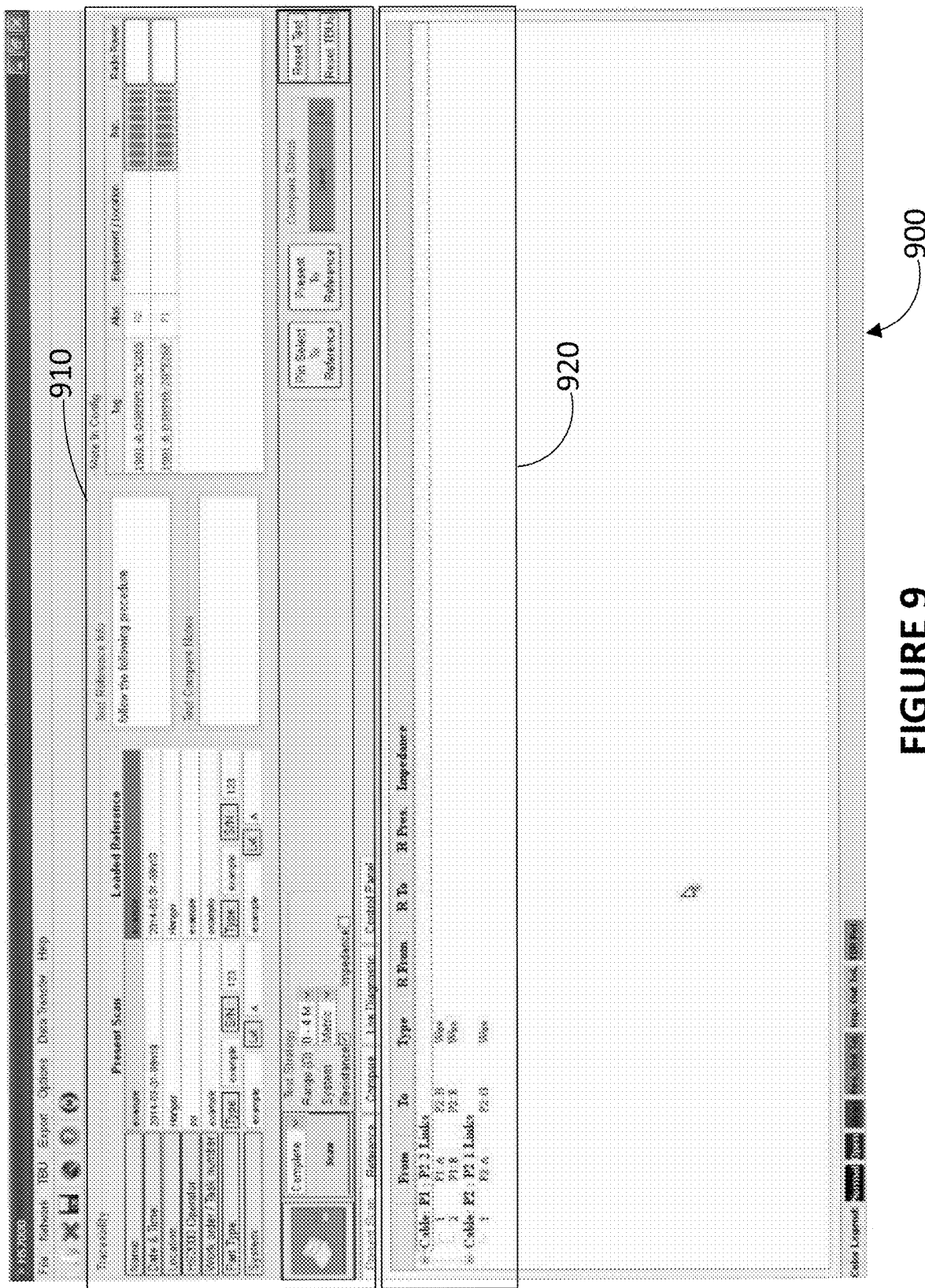
FIG. 9 is a screenshot illustrating a user interface for performing a test of electrical equipment, according to an embodiment.

FIG. 9 shows a user interface 900 for performing a test of electrical equipment such as scanning a wire harness. A test panel 910 shows the test specifications of the test being performed (name of the test, date & time, references used, state of the battery, state of the test, etc.). The results panel 920 shows the interconnection results, for example a list of connections between terminations, the impedance of the link between them, type of connector, and the like.

Figure 10A:
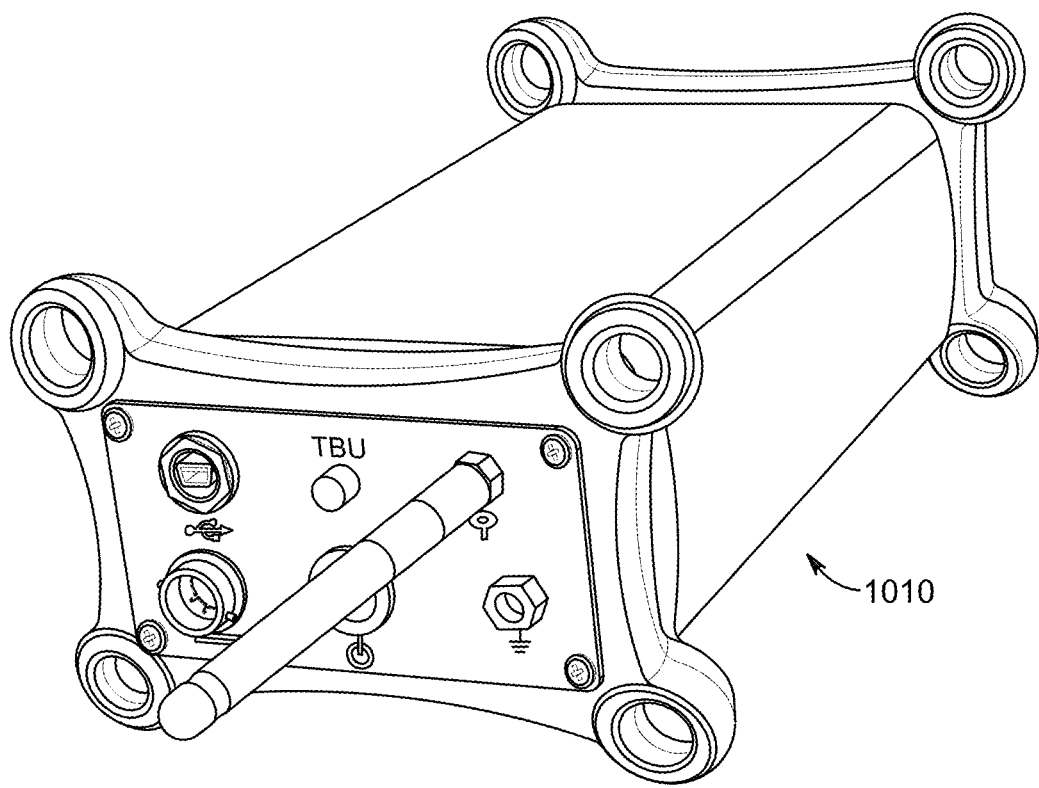
FIGS. 10A to 10C are pictures illustrating embodiments of testing equipment.
Figure 10B:
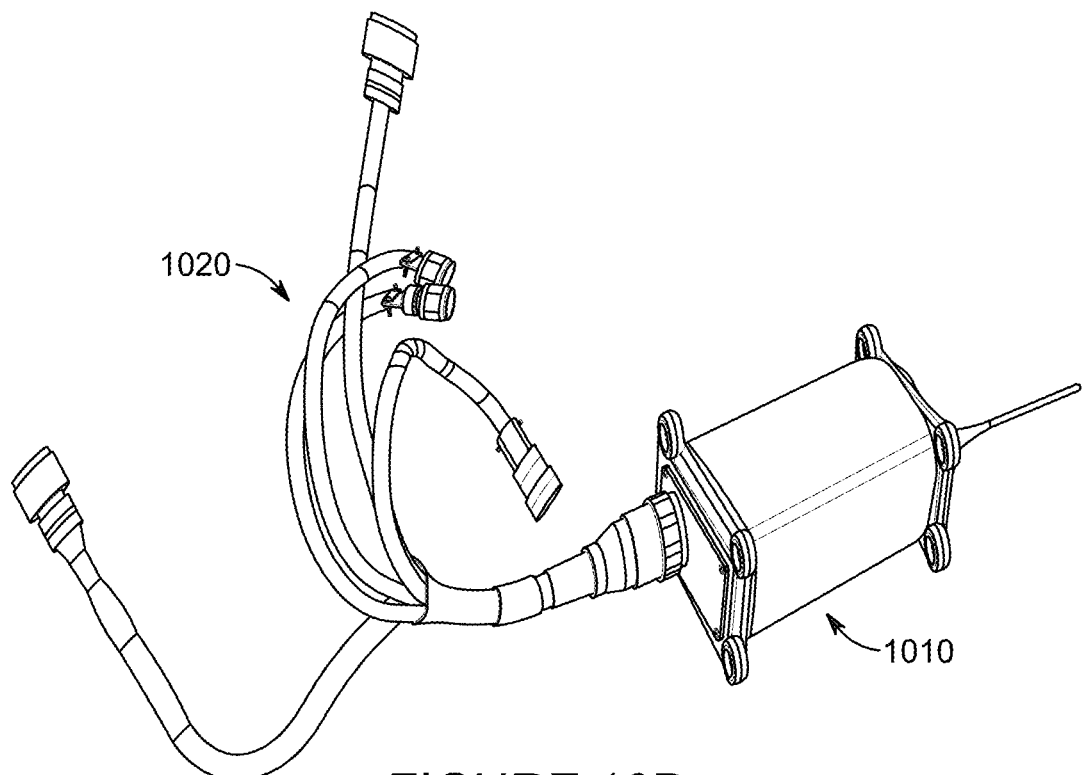
Figure 10C:
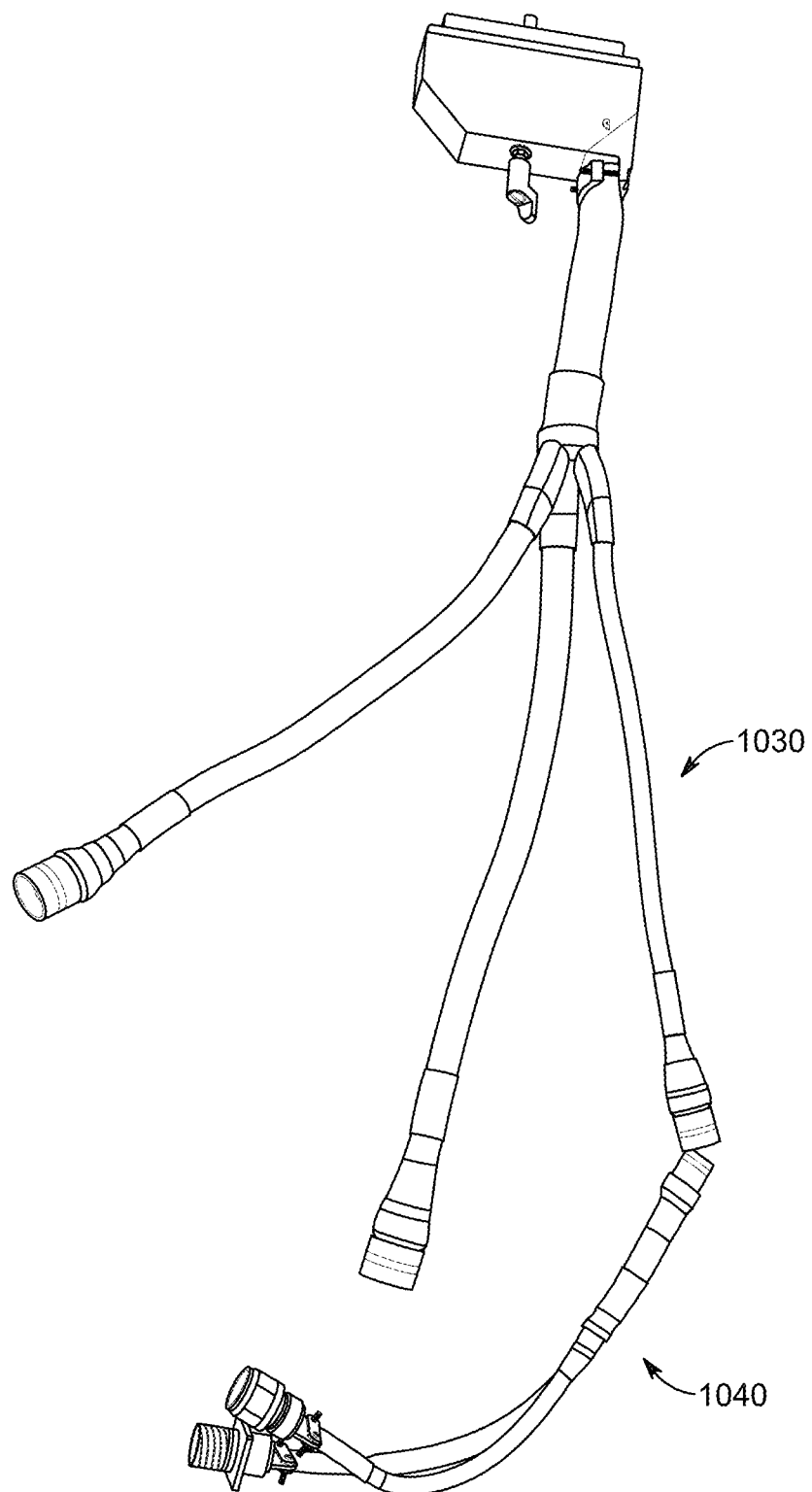

FIG. 10A shows a test box unit 1010 which is a part of automated testing equipment (ATE), according to an embodiment. FIG. 10B shows a test box unit 1010 having mating cables 1020 connected thereto. These cables 1020 are an example of cables that can have missing connectors at their end, thereby causing the necessity to manufacture a connector at least in part. FIG. 10C shows an interface having first-level mating cables 1030 and second-level mating cables 1040.

Figure 11:
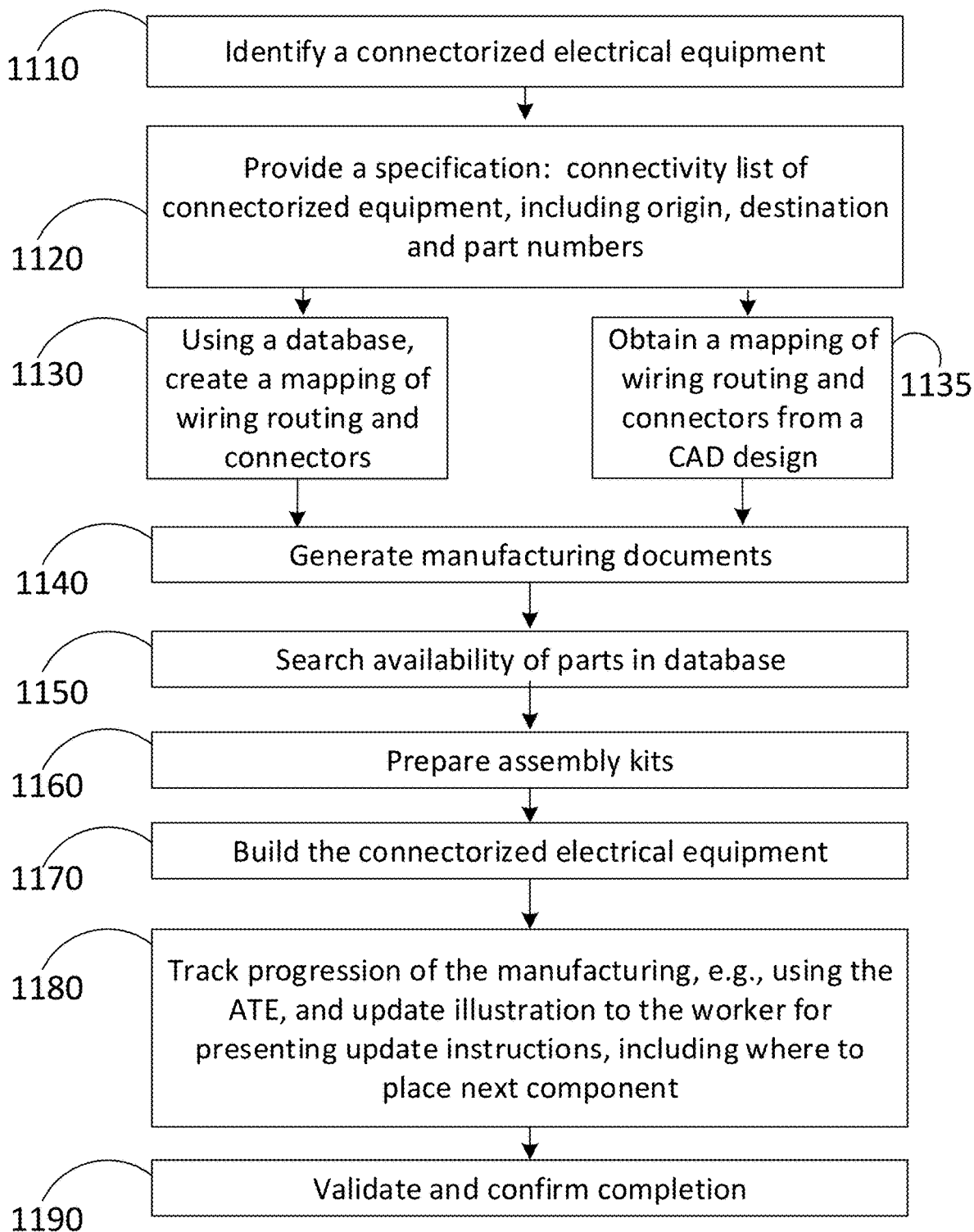
FIG. 11 is a flowchart of a method for producing connectorized equipment and managing the production thereof, according to an embodiment.
Figures 12, 13:
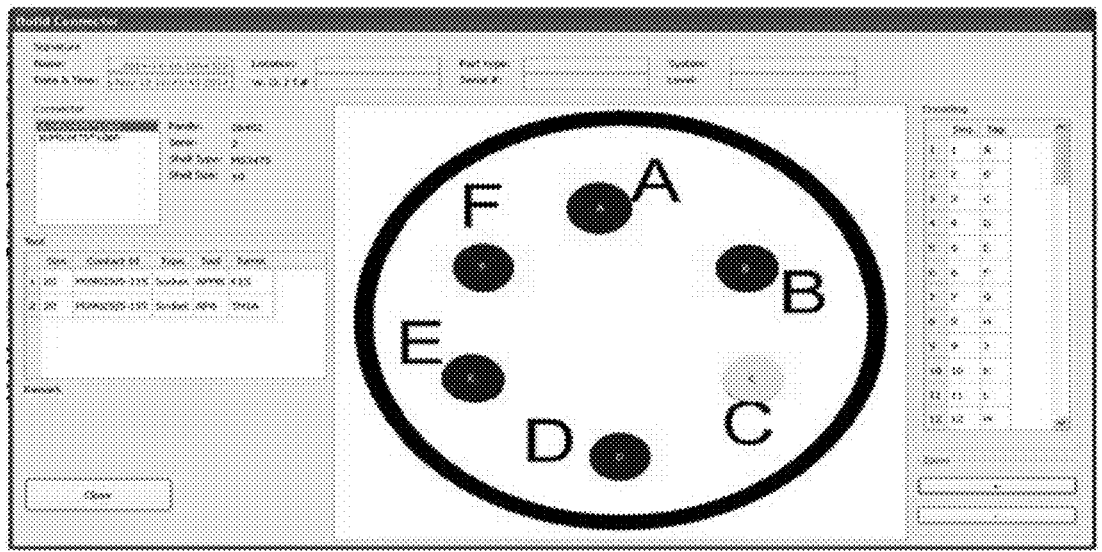
FIG. 12 is a table illustrating an example of a net list, or connectivity list, which is an input specification for the method, according to an embodiment.
FIG. 13 is a screenshot illustrating a graphical interface for displaying an illustration of a next contact to be performed when instructing a worker for assembling connectorized equipment, according to an embodiment.

Now referring to FIG. 11, there is shown a flowchart for manufacturing connectorized electrical equipment and managing (i.e., making a follow-up and updating instructions) the manufacturing by the skilled worker. According to an embodiment, the construction plan of connectorized equipment can be generated and its fabrication can be tracked. The overall result allowed by the method is that upon providing a net list, or connectivity list, of connectorized equipment, as shown in FIG. 12, and optionally a CAD design, the method accesses a comprehensive database in which data can be pulled to generate a construction plan of the connectorized electrical equipment.

The connectorized electrical equipment should first be identified (step 1110), for example as a result of the determination of a part to be manufactured as described above, although any other context of manufacture may be relevant for the method presently described. There would then be provided a connectivity list (step 1120), such as the one shown in FIG. 12. Another exemplary net list, or connectivity list, would be one where the connectorized electrical equipment comprises a connector A wired to a connector B, where A pin 1 connects to B pin 2, A pin 2 connects to B pin 3, A pin 3 connects to ground and A pin 4 connects to B pin 4. This is an example of a net list for a connectorized electrical equipment. In addition to the connectivity list, part numbers for each connector should be provided in order to know the identity/shape of that connector. Wire identifiers may also be provided, although they are not necessary.

The Autocad™ plan or any other CAD data can be provided for construction (step 1135), although it can also be generated (step 1130) if not provided. This is done by applying the logics of the net list to the context of connectorized equipment and by inserting the part numbers to the connectors to draw a complete construction plan of the connectorized electrical equipment.

Therefore, the construction plan (drawing) is generated, including a bill of materials (BOM), and along with a set of instructions for making the actual connections for instructing and tracking the manufacture (step 1140). The generation is made possible by querying a database comprising a comprehensive library of connectors and various electrical parts in the industrial context of interest (aircraft, trains, ships, building, etc.). The library of connectors and electrical parts further comprises comprehensive information on contact arrangement and preferably comprises images to be able to provide picture-based assistance to the worker when the manufacturing progresses. The construction plan provided to the worker should comprise an image of the origin connector (which needs to be a connector for the electrical equipment to be connectorized and thus usable in the present context) with contacts mapped on the image, the destination electrical component which can be a connector but can be another electrical component (e.g., connector, terminal board, lugs, splice, etc.) with contacts, and wiring information for interconnection between contacts of both the origin and the destination connector(s)/equipment. The information may also include the routing of the wiring in the connectorized equipment and/or in the vehicle or equipment in which it is installed.

Prior to starting manufacture, all subparts that have been identified in the construction as being required (i.e., the BOM) should be searched in the database. This can be done automatically by software tools that, upon identifying a subpart, query inventory databases to find the subpart. Availability of subparts can thus be determined at this step (1150), or if not available, they are ordered or manufactured as discussed above.

Assembly kits can thus be prepared (step 1160) and forwarded to the skilled worker for assembly, either at the testing facility as mentioned above, or at any other convenient location, including a manufacturing plant.

The building process of the connectorized electrical equipment comprises the assembly and interconnection of the connectors and the various electrical components of the connectorized electrical equipment (step 1170). This fabrication process can be tracked and instructions can be given (step 1180). Since the construction plan (drawing) was generated along with a set of instructions for making the actual connections for instructing in step 1140, a first instruction can be generated and displayed to the skilled worker, e.g., "connect this wire from here to there", including an actual illustration of where to make the connection of the wire on the connector as shown in FIG. 7 or 8. For example, an actual pin to which the wire should be connected can be highlighted in some way on a diagram as shown in FIGS. 7-8. This is shown in FIG. 13 where a picture or illustration of the actual connector (the one into which connections have to be made for assembling) is shown, where pins are highlightable by a computer 1400 treating the image; for instance, pin C is of another color. If no wire identifier was provided in the first place, the method attributes such an identifier to the wires provided in the assembly kit such that the worker is instructed to connect the right wire at the right place within the connectorized electrical equipment being built.

According to an embodiment, and as described further below, the visual instructions are rather provided in the form of virtual reality or augmented reality visual aids for wiring routing, parts installation and connector terminations.

Figure 14:
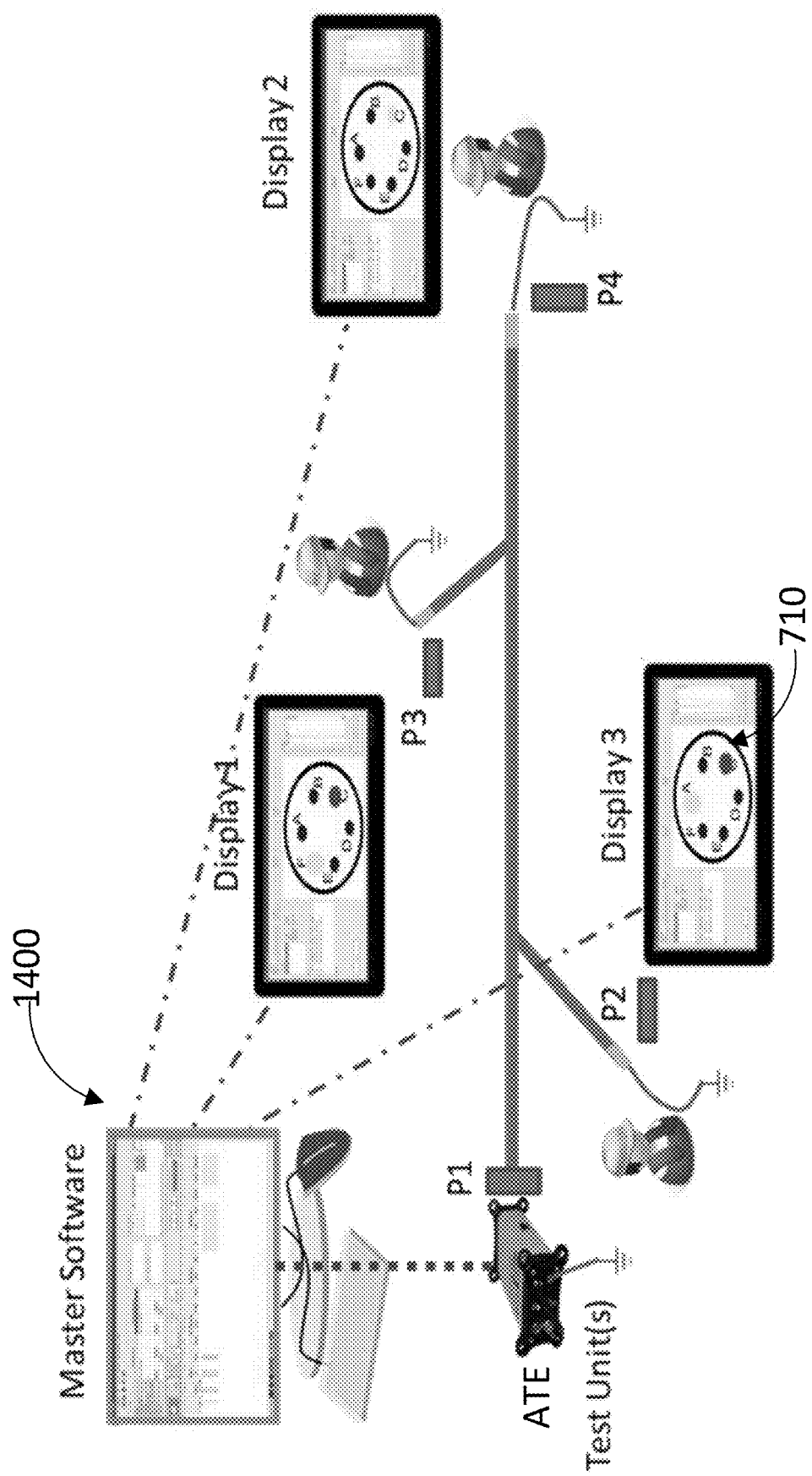
FIG. 14 is a diagram illustrating an assembly of connectorized equipment where an ATE is connected to a connector thereof and instructions are generated by a computer in order to display an illustration of assembling instructions, as shown in FIG. 13, to a worker, according to an embodiment.

At every step of production, the skilled worker can provide information to the computer 1400 (the one providing the tracking instructions) about each connection being made to inform the computer that the step is completed. This can be made by manual insertion using visual aids provided by the manufacturing documentation. Alternatively, and more interestingly, once at least one origin connector has been assembled or pre-assembled, the ATE can be connected to the electrical equipment being built identify a contact that needs to be installed and further to track the assembly process. As shown in FIG. 14, the ATE is connected to the at least one (origin, e.g., P1) connector of a connectorized equipment comprising various destinations (e.g., P2, P3, P4), and can thus automatically detect or identify a successful completion of a new connection performed according to the predetermined plan and instruct the computer 1400 to update the instructions that are displayed to the skilled worker(s), who can then perform the next connection. This is displayed on their own display, where an illustration of their portion of connectorized equipment to assemble is displayed (interface 710) and the next operation to perform is highlighted is some way.

Validation of the connectorized electrical equipment can be performed as discussed above (step 1190), where quality control testing validation is performed using a test equipment connected to the electrical equipment. Although not shown as such, it appears that quality control testing is performed all along fabrication, with which it is performed simultaneously for immediate fault identification and immediate quality control upon fabrication. Completion of the fabrication is then confirmed and data on the newly assembled part are saved in a database as discussed above.

As a result, upon providing a specification, i.e., a net list of a connectorized electrical equipment, such as shown in FIG. 12, a construction plan including a drawing of the connectorized electrical equipment and various sub-components thereof, a BOM and instructions for assembly can be generated and displayed on an illustrative and updatable display such as the interface 710 shown in FIGS. 13-14. Those can then be used along with the ATE to instruct a worker for the assembly, track assembly advancement by the ATE connected on the at least one (origin) connector of the connectorized equipment, and update instructions accordingly for fast and reliable assembly. A faster production pace with higher quality is provided by enhancing automation by tracking the progression of the manufacturing operations using a test equipment connected to the electrical equipment.

This can be applied to the manufacture of faulty parts as discussed above. This can also be applied to the manufacture of connectorized equipment in more interesting environments. For example, harnesses in ships are often made in-situ, on the ship, where workers are often in large numbers and obstruct each other especially when testing that connections on long distances were done properly. The manufacture and testing can be performed faster and together on the ship or in a controlled facility, using the present method in which the wires are connectorized while being tested and where a computer instructs the worker on which pin to connect a wire instead of requiring the worker to reading conventional wiring diagrams and net lists. The method would also be applicable to buildings, which comprise a few connectorized parts (e.g., an electrical board) and could comprise more in the future.

According to an embodiment, steps requiring the user to act on the connectorized electrical equipment and/or to observe the connectorized electrical equipment can be improved by the use of augmented reality and/or virtual reality.

While augmented reality or virtual reality, which requires a helmet or glasses, has been considered a work hazard in harsh work environments due to danger for the technician of hitting (or falling on) people or equipment, virtual reality or augmented reality aids for wiring routing and connector terminations of connectorized equipment can be particularly advantageous, as long as the technician is stationary and is not required to move around, blinded by his augmented reality equipment.

Examples of steps requiring the user to act on the connectorized electrical equipment and/or to observe the connectorized electrical equipment can include, without limitation: assembling the connectorized electrical equipment, in which case routing and connections need to be made; repairing the connectorized electrical equipment, in which case routing, parts installation and connections can also be made; and testing, in which case the user needs to determine where and how test units need to be connected to the connectorized electrical equipment.

Figure 16:
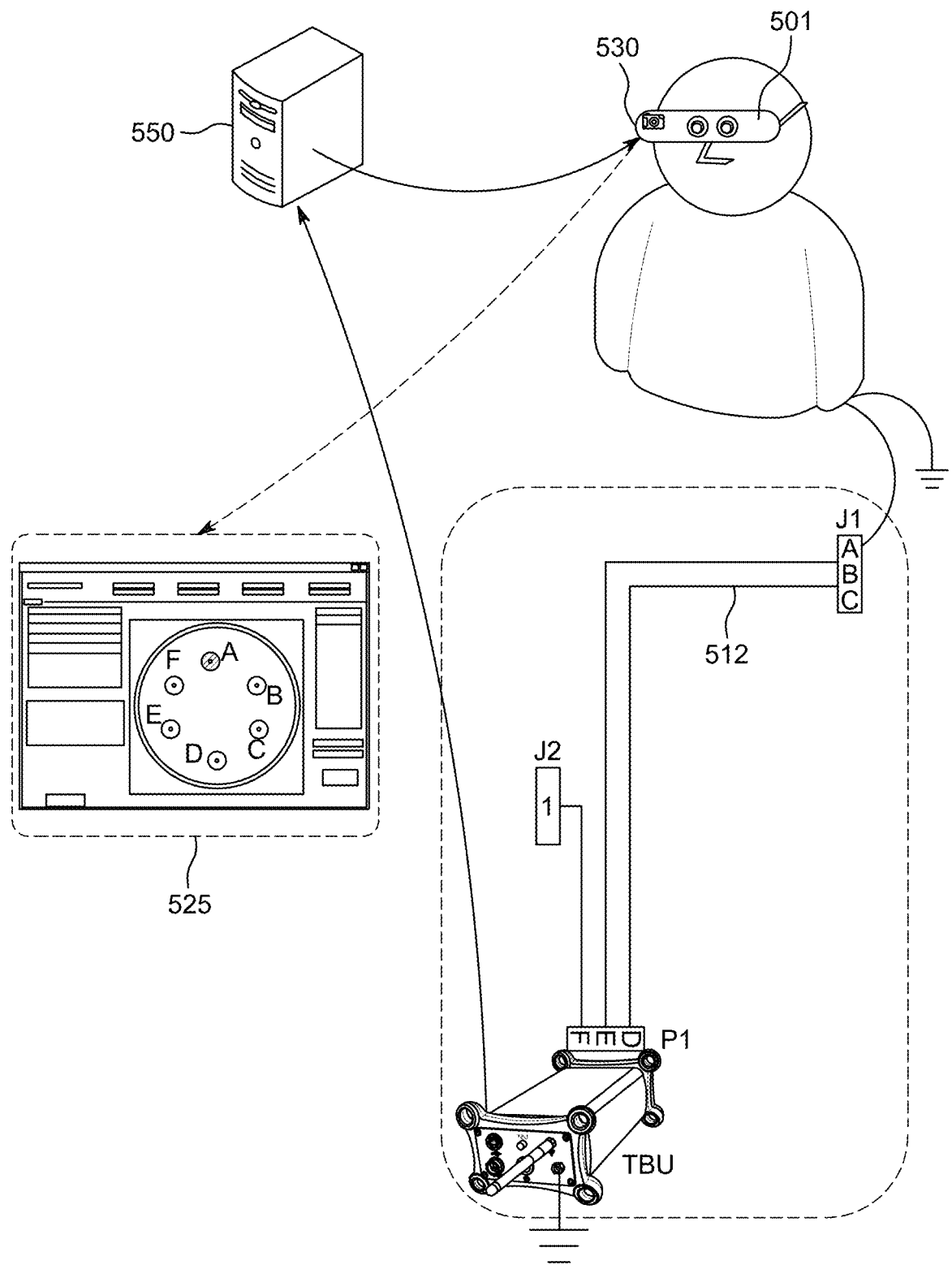
FIG. 16 is a diagram illustrating the use of an apparatus for augmented reality for assembling comprising routing of wiring by presenting a visual aid based on a monitoring by a TBU, according to an embodiment.

FIG. 16 shows a user being presented a visual aid when wearing an augmented reality apparatus during the assembling, repairing or maintenance of connectorized electrical equipment.

Figure 17:
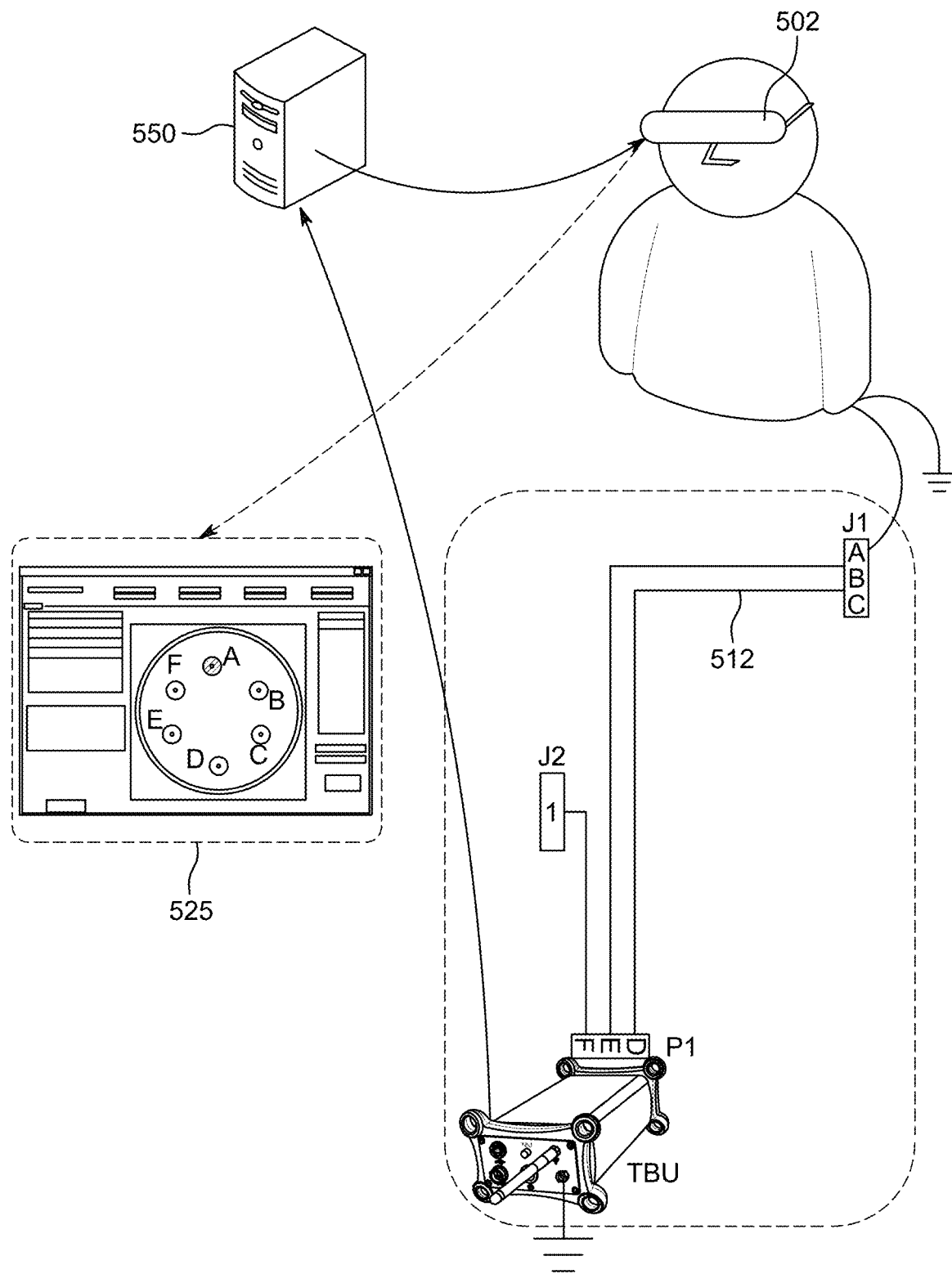
FIG. 17 is a diagram illustrating the use of an apparatus for virtual reality for assembling comprising routing of wiring by presenting a visual aid based on a monitoring by a TBU, according to an embodiment.

FIG. 17 shows a user being presented a visual aid when wearing a virtual reality apparatus during the assembling, repairing or maintenance of connectorized electrical equipment. Although the user is shown wearing a helmet, which would be advantageous for teaching, the virtual reality can instead be presented on a display screen, thus allowing the user to work on the connectorized electrical equipment without having a helmet.

Figure 18:
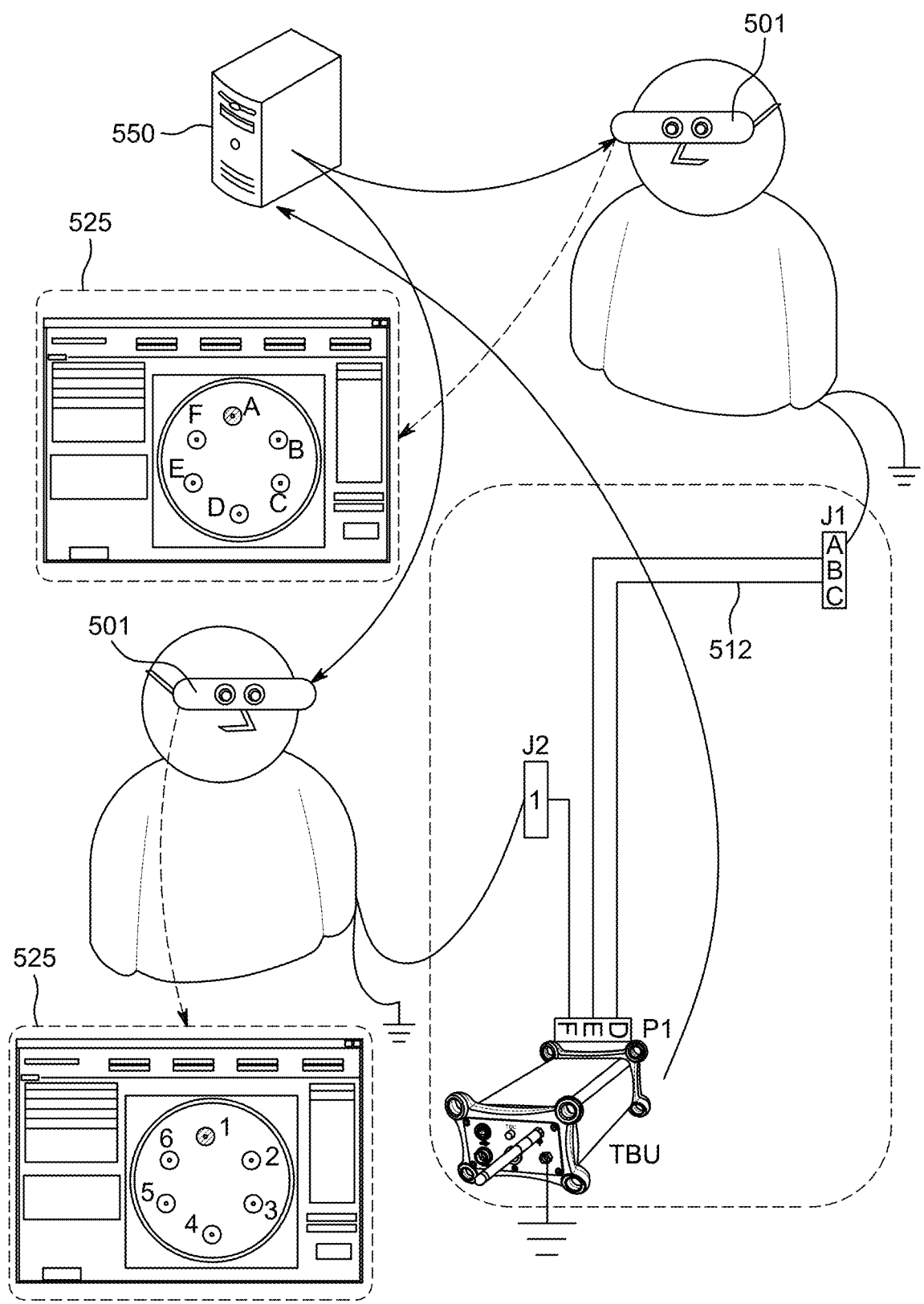
FIG. 18 is a diagram illustrating the use of two apparatuses for augmented reality for assembling comprising building a connector by presenting a visual aid based on a monitoring by a TBU, according to an embodiment.

FIG. 18 shows more than one user, for instance two users in this exemplary embodiment, being both presented a visual aid when wearing an augmented reality apparatus during the building of a connector (part) by assembling sub-parts thereof. Identification of a task to perform is displayed by the visual aid 525. For example, the TBU is connected to connector P1 and in communication with computer 550 which in turn is in communication with the apparatuses 501. Therefore, when a first user makes a connection of a wire in a cable with pin A of connector J1, the other user is shown to make the appropriate connection, for example with pin 1 of connector J2. Hence, the visual aid 525 is useful to ensure that the users cooperate and perform their current work based on the most recent actions of the other workers. The visual aid 525 is therefore outputted to a plurality of apparatuses 501, and is personalized for each one of the apparatuses because the next step for each worker (in a team of users working simultaneously) is generally different.

Figure 19:
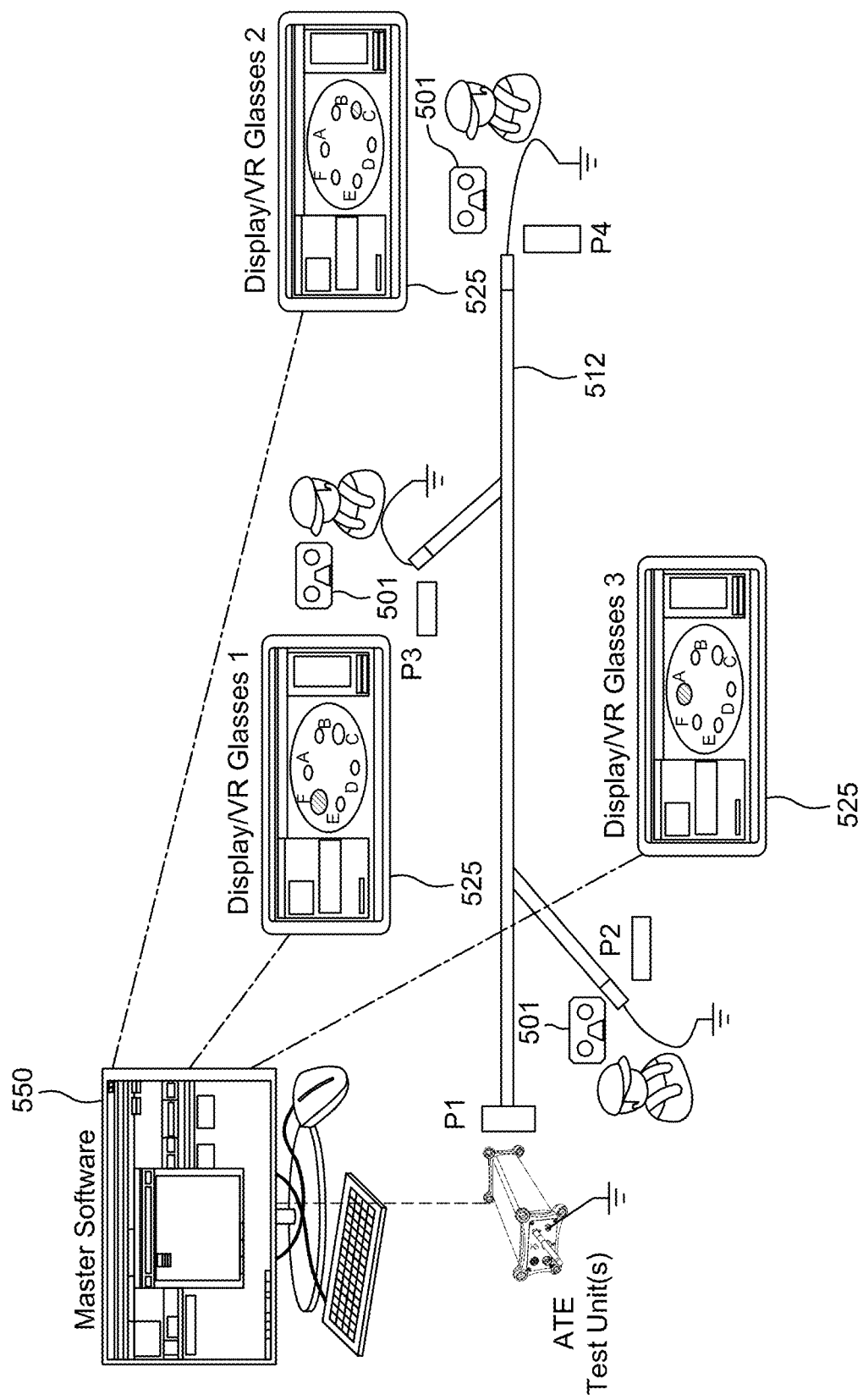
FIG. 19 is a diagram illustrating an assembly of connectorized equipment where an ATE is connected to a connector thereof and instructions are generated by a computer in order to display, on an apparatus for augmented reality, a personalized visual aid of assembling instructions, to a plurality of workers in a team on the connectorized equipment, according to an embodiment.

This is also shown in FIG. 19, in which a plurality of workers receives information for their required task, as in FIG. 14, but with the visual aid 525 presented on an apparatus for augmented reality, or an apparatus for virtual reality, 501. Each worker receives his dedicated, personalized visual aid depending on their exact task to be performed, because the "next step" depends on the exact location of the worker on the connectorized equipment, and many of the occurrences of "next step" can be performed simultaneously or independently by the plurality of workers on the same connectorized equipment.

Augmented reality is normally provided by an apparatus for augmented reality, 501, as shown in FIGS. 16 and 18, where the dashed frame represents what the user sees (at least in part). Augmented reality comprises providing to a user information, referred to as a visual aid 525, about the environment in which the user is, usually superimposed with the environment. For instance, the user is expected to see, at least partially, the environment, especially the environment in which the connectorized electrical equipment is located. To allow the user to see, at least partially, the environment in which the connectorized electrical equipment is located, the field of view of the user may be left unobstructed, but more commonly, the apparatus for augmented reality comprises a glass or an equivalent thereof (i.e., a transparent surface), mounted on goggles or spectacles. The transparent surface is used to display (e.g., by retro-projection, displaying, etc.) the additional information to the user.

Therefore, this additional information is provided along the environment being seen through the transparent surface. The additional information or visual aid 525 can be text (such as instructions for connections, routing, or other assembling steps to perform), images (such as a picture of a connector located on the transparent glass to show what should be assembled and where it should be assembled), and other graphical elements such as highlighting, flashing, arrows and other visual cues, as shown in FIGS. 16-18.

Practically, the apparatus for augmented reality, 501, is usually provided as glasses, goggles, visors, or other types of head-mounted displays.

In another embodiment, the visual aid 525 can also be provided by projection, by projectors present in the environment, onto the connectorized electrical equipment. In such cases, the augment reality apparatus 501 may not be required.

According to an embodiment, the connectorized electrical equipment is monitored by the ability of the test box unit (TBU) of the automated test equipment (ATE) to detect and collect information on the connectorized electrical equipment and identify new connections being performed by a user on the connectorized equipment. By identifying which connector is connected (both in terms of connector identity and where it is connected on the connectorized equipment), the TBU can determine a current state of the connectorized equipment being assembled, maintained or repaired, and feeds a computer 550 either with raw data or processed information to ensure that the computer 550, with the master software executed thereon, understands the state of connectivity of the connectorized equipment on which the TBU performs real-time tracking of connections.

The apparatus 501 may therefore be used with the computer 550 to determine what parts of the connectorized equipment are being observed and what is their state of connectivity. If the user is assembling or repairing the connectorized electrical equipment, the computer may compare the data obtained from the TBU, which represent the current state of the connectorized electrical equipment 512, to the construction plan or connectivity list, to determine what steps were performed (if any), and what is the next step. Determining the next step may be a selection of the remaining steps to be performed according to the connectivity list, either randomly selected, selected as being necessary to complete further tasks, or selected as being appropriate because a particular task is under completion, for example as shown in FIG. 18 in which a worker is shown to perform a connection to connector "1" in response to his coworker having made a connection to connector "A". If maintenance of the connectorized equipment is being performed, the computer 550 may also determine what is the faulty part among those being observed or what are the connectors which are available for connecting a test unit, for example, thereby being able to determine what is the next maintenance step.

Optionally, the apparatus 501 can comprise a camera 530 (shown as an example in FIG. 16) to feed the images to the computer 550 to better understand the environment and to aid in presenting a visual aid 525 in superimposition over the actual environment. Without the camera, the visual aid can be presented in the field of view of the user by the apparatus 501, but may not be in superimposition with elements of the actual environment.

When the next step is determined by the computer 550, the computer 550 may retrieve or generate the text instructions, the images and the other visual cues to display in relation with the step that is determined to be the next step. Together, the text instructions, the images, and the other visual cues act as a visual aid 525 to the user. By comparing the images being observed through the apparatus 510 by the user, the computer 550 may locate the text instructions, the images and the other visual cues on the transparent surface of the apparatus 510 which acts as a display, to ensure that the elements such as arrows indicating connections to make are properly located in the field of view of the user.

According to an embodiment, the text instructions can be read by voice synthesis while the visual aid is presented.

According to an embodiment, the visual aid 525 is also presented, at least partially, on a computer screen or tablet, simultaneously with the apparatus for augmented reality, 501. In a more specific embodiment, the user may choose to switch from one display (computer screen or tablet) to another (apparatus for augmented reality 501).

According to another embodiment, the apparatus used for presenting the visual aid 525 is rather an apparatus of virtual reality, 502, as shown in FIG. 17. If the apparatus is a helmet, as shown, this apparatus 502 occupies most, if not all, of the user's field of view. The environment is therefore not seen by the user, and the apparatus rather presents a virtual environment where the current state of the connectorized electrical equipment, 512, is reproduced to a virtual representation thereof, i.e., the visual aid 525. Such a context may be particularly well adapted for teaching, practicing or having a remote user perform a task which is done locally by a mimicking robot.

More practically, the apparatus 502 can be a display screen which is not worn and therefore does not obstruct the user's field of view, in which case the apparatus can advantageously present other immersive capabilities, such as 3D display. The visual aid 525 is thus presented in a virtual environment which is provided as a replacement of the actual environment, either in the user's field of view or simply aside the environment of the equipment. The virtual environment may be advantageously free of distractions and unnecessary elements that would be present in the environment. The virtual environment is also advantageous in that the visual aid presented by the apparatus does not need to be precisely located superimposed with real elements of the environment.

Figure 15:
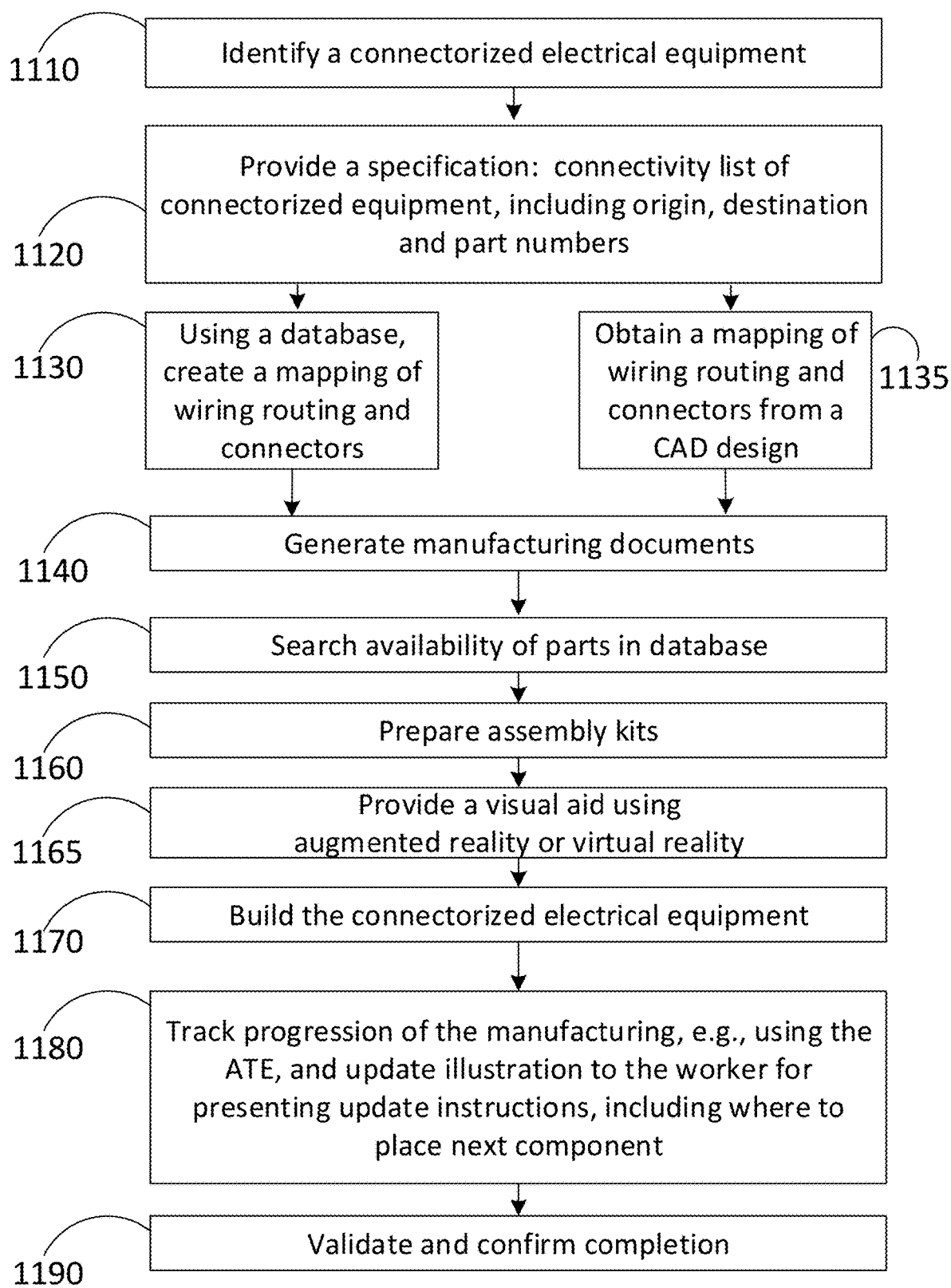
FIG. 15 is a flowchart of a method for producing connectorized equipment and managing the production thereof, according to another embodiment using augmented reality or virtual reality.

FIG. 15 illustrates that the method shown in FIG. 11 can be modified to provide the visual aid, not necessarily by the computer screen or tablet, but rather (or in addition) by using an apparatus for augmented reality or virtual reality. Step 1165, in which a visual aid is provided in this manner, is thus performed when assembling connectorized electrical equipment, whether under construction, repair or maintenance.

Even though other tasks need to be performed by a computer, such as artificial vision, preparation of the visual aid to be presented and localization of the visual aid in the field of view of the user, the other steps remain substantially the same from a workflow or user point of view. The other steps 1110 to 1190 (excluding step 1165) thus remain the same in comparison with the flowchart of FIG. 11.

Determination of tasks to perform, regardless of the purpose, thus requires using data regarding the connectorized electrical equipment, in particular the connectivity list, as discussed above.

While preferred embodiments have been described above and illustrated in the accompanying drawings, it will be evident to those skilled in the art that modifications may be made without departing from this disclosure. Such modifications are considered as possible variants comprised in the scope of the disclosure.

The invention claimed is:

1. A method for assembling or repairing an connectorized electrical equipment in an environment, the method comprising the steps of:
    obtaining a unique identifier of an origin connector of the connectorized electrical equipment to be assembled or repaired;
    at a computing device, receiving the unique identifier of the origin connector of the connectorized electrical equipment to be assembled or repaired;
    at the computing device, identifying a connection between the origin connector of the connectorized electrical equipment to be assembled or repaired and a destination electrical component; and
    at the computing device, determining the connection with a connectivity list required for the connectorized electrical equipment to determine a next step of the assembling or the repairing which depends on the connection identified by the computing device.

2. The method of claim 1, further comprising:
    generating a visual aid representative of the next step and outputting the visual aid to an apparatus which provides, to a user, the visual aid superimposed with the environment or in a virtual environment.

3. The method of claim 2, wherein the visual aid comprises an illustration of at least one of the origin connector and the destination electrical component, in which the connection between the origin connector and the destination electrical component is highlighted.

4. The method of claim 2, wherein generating the visual aid to the apparatus comprises outputting the visual aid to an augmented reality apparatus which provides the visual aid superimposed with the environment.

5. The method of claim 2, wherein generating the visual aid to the apparatus comprises outputting the visual aid to a virtual reality apparatus which provides the visual aid in a virtual environment.

6. The method of claim 2, wherein outputting the visual aid comprises outputting a personalized visual aid to a plurality of apparatuses.

7. The method of claim 6, wherein a current state of the connectorized electrical equipment in the environment is obtained by a camera or a sensor on each one of the plurality of the apparatuses.

8. The method of claim 2, wherein obtaining the unique identifier of the origin connector comprises a manual reading of the unique identifier.

9. The method of claim 8, wherein the manual reading of the unique identifier comprises the manual reading of any one of: a serial number, a model number or a standard number forming the unique identifier that is on the connectorized electrical equipment.

10. The method of claim 8, wherein obtaining the unique identifier of the origin connector comprises collecting a vocal instruction from a user.

11. The method of claim 10, wherein collecting the vocal instruction from the user comprises reading any one of: a serial number, a model number or a standard number forming the unique identifier that is physically printed on the connectorized electrical equipment.

12. The method of claim 10, wherein collecting the vocal instruction from the user comprises collecting the vocal instruction from the apparatus which provides the visual aid to the user.

13. The method of claim 8, wherein determining the connection comprises collecting a vocal instruction from a user.

14. The method of claim 1, further comprising:
    based on the step of identifying the connection, updating an assembly status to automatically provide updated instructions for the connection between the origin connector and the destination electrical component according to a construction plan until completion.

15. The method of claim 1, wherein the connectivity list for the connectorized electrical equipment comprises the origin connector and an origin-connector identifier thereof, the destination electrical component and a destination-electrical-component identifier thereof; and a list of connections between the origin connector and the destination electrical component.

16. The method of claim 15, further comprising:
    querying a database comprising a library of electrical components with the connectivity list;
    generating a construction plan for the connectorized electrical equipment; and
    generating, from the construction plan, instructions and illustrations of connections to be performed for assembling.

17. The method of claim 1, further comprising:
    generating a list of components required for assembling the connectorized electrical equipment;
    in an inventory database, identifying components that are not available; and
    manufacturing the components that are not available using a 3D printer.

18. The method of claim 1, wherein the connection comprises at least one of: a contact of the connector, a wire of the connector, a backshell of the connector, or any electrical component of the connectorized electrical equipment.

\* \* \* \* \*